United States Patent
Valley et al.

(10) Patent No.: US 9,413,372 B1
(45) Date of Patent: Aug. 9, 2016

(54) SYSTEMS AND METHODS FOR CONVERTING RADIO FREQUENCY SIGNALS INTO THE DIGITAL DOMAIN USING MULTI-MODE OPTICS

(71) Applicant: THE AEROSPACE CORPORATION, El Segundo, CA (US)

(72) Inventors: George C. Valley, Los Angeles, CA (US); George A. Sefler, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 14/814,048

(22) Filed: Jul. 30, 2015

(51) Int. Cl.
| | | |
|---|---|---|
| H03M 1/00 | (2006.01) | |
| H03M 1/12 | (2006.01) | |
| G02B 27/48 | (2006.01) | |
| G02F 7/00 | (2006.01) | |

(52) U.S. Cl.
CPC ............... *H03M 1/002* (2013.01); *G02B 27/48* (2013.01); *G02F 7/00* (2013.01); *H03M 1/1245* (2013.01)

(58) Field of Classification Search
CPC .... H03M 1/002; H03M 1/1245; G02B 27/48; G02F 7/00; H04N 5/74; H04N 5/7425; H04N 5/7416; H04N 9/3129; H04N 9/3161; A61B 8/481; A61B 8/5207; A61B 8/5246; A61B 8/14; A61B 8/06; A61B 8/13
USPC ................... 341/130–155; 382/107; 600/458; 359/287, 285; 348/E5.137, E5.139, 348/E5.13
See application file for complete search history.

(56) References Cited

U.S. PATENT DOCUMENTS

| | | | |
|---|---|---|---|
| 4,851,840 A | 7/1989 | McAulay | |
| 6,236,862 B1 | 5/2001 | Erten et al. | |
| 6,326,910 B1 | 12/2001 | Hayduk et al. | |
| 6,346,124 B1 * | 2/2002 | Geiser .................. | G06T 7/0012 600/450 |
| 6,404,366 B1 | 6/2002 | Clark et al. | |
| 6,445,487 B1 * | 9/2002 | Roddy .................... | G02F 1/116 348/E5.137 |
| 6,724,334 B2 | 4/2004 | Tzelnick | |
| 6,801,147 B2 | 10/2004 | Thylen et al. | |
| 7,321,731 B2 | 1/2008 | Ionov et al. | |
| 7,536,431 B2 | 5/2009 | Goren et al. | |

(Continued)

OTHER PUBLICATIONS

Beck et al., "A fast iterative shrinking-thresholding algorithm for linear inverse problems," SIAM Journal on Imaging Sciences 2(1): 183-202 (2009).

(Continued)

*Primary Examiner* — Lam T Mai
(74) *Attorney, Agent, or Firm* — Jones Day; Jaime D. Choi

(57) ABSTRACT

A multi-mode optic can receive as input a radio-frequency (RF) signal imposed on an optical carrier, and can output a speckle pattern. A digital representation of the radio-frequency signal can be obtained based on the speckle pattern. An optical sensor can be irradiated with a first portion of the speckle pattern, the first portion of the speckle pattern including an optical intensity profile that is different than an optical intensity profile of a second, spatially separated, portion of the speckle pattern. The multi-mode optic can impose the optical intensity profile on the first portion of the speckle pattern as a function of wavelength of the optical carrier. The optical intensity profiles of portions of the speckle pattern can define a mixing matrix. The digital representation of the RF signal can be obtained based on an output of the optical sensor and the mixing matrix.

20 Claims, 17 Drawing Sheets

(56) References Cited

U.S. PATENT DOCUMENTS

| | | | |
|---|---|---|---|
| 7,834,795 | B1 | 11/2010 | Dudgeon et al. |
| 8,026,837 | B1 | 9/2011 | Valley et al. |
| 8,260,442 | B2 | 9/2012 | Christensen et al. |
| 8,902,096 | B2 | 12/2014 | Valley et al. |
| 2002/0114057 | A1* | 8/2002 | Roddy .............. G02F 1/116 359/278 |
| 2002/0126981 | A1* | 9/2002 | Roddy .............. G02B 6/42 385/147 |
| 2002/0154375 | A1* | 10/2002 | Roddy .............. G02B 27/48 359/287 |
| 2008/0015440 | A1* | 1/2008 | Shandas .............. A61B 8/06 600/458 |
| 2008/0062028 | A1 | 3/2008 | Chang |
| 2010/0201345 | A1 | 8/2010 | Gupta et al. |
| 2010/0241378 | A1 | 9/2010 | Baraniuk et al. |
| 2011/0234436 | A1 | 9/2011 | Bogoni et al. |
| 2014/0147013 | A1* | 5/2014 | Shandas .............. A61B 8/481 382/107 |
| 2014/0240163 | A1 | 8/2014 | Boufounos |
| 2015/0036021 | A1 | 2/2015 | Gigan et al. |

OTHER PUBLICATIONS

Chen et al., "Atomic decomposition by basis pursuit," SIAM Journal on Scientific Computing 20(1): 33-61 (1998).

Tropp et al., "Signal recovery from random measurements via orthogonal matching pursuit," IEEE Trans. on Information Theory 53(12): 4655-4666 (2007).

Bortnik et al., "Predistortion technique for RF-photonic generation of high-power ultrawideband arbitrary waveforms," J. Lightwave Technology 24(7):2752-2759 (2006).

Bosworth et al., "High-speed ultrawideband compressed sensing of sparse radio frequency signals," CLEO: 2014, OSA Technical Digest (online) (Optical Society of America, 2014), paper SM1G.6 (4 pages).

Bosworth et al., "High-speed ultrawideband photonically enabled compressed sensing of sparse radio frequency signals," Opt. Lett. 38(22):4892-4895 (2013).

Candes et al., "An Introduction to Compressive Sampling," IEEE Signal Processing Magazine 25(2):21-30 (2008).

Candes et al., "Near Optimal Signal Recovery From Random Projections: Universal Encoding Strategies?" IEEE Trans. on Information Theory 52(12):5406-5425 (2006) Submitted Oct. 2004, Revised Mar. 2006.

Chi et al., "Microwave spectral analysis based on photonic compressive sampling with random demodulation," Opt. Lett. 37(22):4636-4638 (2012).

Chou et al., "Adaptive RF-Photonic Arbitrary Waveform Generator," IEEE Photonics Technology Letters 15(4): 581-583 (2003).

Chou et al., "Photonic bandwidth compression front end for digital oscilloscopes," J. Lightwave Technology 27 (22):5073-5077 (Nov. 15, 2009).

Donoho, David, "Compressed Sensing," IEEE Trans. on Information Theory 52(4):1289-1306 (2006) (Epub Sep. 14, 2014).

Gupta et al., "Power scaling in time stretch analog-to-digital converters," Proceedings of Avionics, Fiber-Optics and Photonics and Photonics Technology Conference, AVFOP '09. IEEE, pp. 5-6 (Sep. 22-24, 2009).

Koh et al., "A Millimeter-Wave (40-45 GHz) 16-Element Phased-Array Transmitter in 0.18-μm SiGe BiCMOS Technology," IEEE Journal of Solid-State Circuits, 44(5):1498-1509 (2009).

Lee et al., "Extreme Chirped Pulse Oscillator (XCPO) Using a Theta Cavity Design," IEEE Photonics Technology Letters 18(7):799-801 (2006).

Lee et al., "33MHz Repetition Rate Semiconductor Mode-Locked Laser Using eXtreme Chirped Pulse Oscillator," Conference on Lasers and Electro-Optics/Quantum Electronics and Laser Science Conference and Photonic Applications Systems Technologies, OSA Technical Digest (CD), 2 pages (Optical Society of America, 2008), paper CTuU7.

Loris, Ignace, "L1Packv2: A Mathematica package for minimizing an l1-penalized functional," pp. 1-17 (Aug. 20, 2008); [retrieved online on Aug. 20, 2008] from the Internet <URL: http://adsabs.harvard.edu/abs/2008CoPhC.179..895L>.

McKenna et al., "Wideband Photonic Compressive Sampling Analog-to-Digital Converter for RF Spectrum.Estimation," in Proceedings of Optical Fiber Communication Conference, (Anaheim, Calif., 2013), paper OTh3D.1 (3 pages).

Min, "SiGe/CMOS Millimeter-Wave Integrated Circuits and Wafer-Scale Packaging for Phased Array Systems," A dissertation submitted in partial fulfillment of the requirements for the degree of Doctor of Philosophy in the University of Michigan (2008) (154 pages).

Mishali et al., "From Theory to Practice: Sub-Nyquist Sampling of Sparse Wideband Analog Signals," [retrieved online on Nov. 10, 2009] from the Internet <URL: http://arxiv.org/abs/0902.4291v3>, pp. 1-17.

Redding et al., "All-fiber spectrometer based on speckle pattern reconstruction," Opt. Express 21(5):6584-6600 (2013).

Sefler et al., "Holographic Multichannel Radio-Frequency Correlator," Optical Engineering 39(1):260-266 (2000).

Sefler et al., "Wide Bandwidth, High Resolution TimeStretch ADC Scalable to Continuous-Time Operation," Proceedings of Conference on Lasers and Electro-Optics, 2009 and 2009 Conference on Quantum electronics and Laser Science Conference, CLEO/QELS 2009, pp. 1-2 (Jun. 2-4, 2009).

Tropp et al., "Beyond Nyquist: Efficient Sampling of Sparse Bandlimited Signals," IEEE Transactions on Information Theory 56(1):520-544 (2010).

Valley et al., "Sensing RF signals with the optical wideband converter", in Broadband Access Communication Technologies VII, Benjamin B. Dingel; Raj Jain; Katsutoshi Tsukamoto, Editors, Proceedings of SPIE vol. 8645 (SPIE, Bellingham, WA 2013), 86450P.

Valley et al., "Optical time-domain mixer", in Optics and Photonics for Information Processing IV, Abdul Ahad Sami Awwal; Khan M. Iftekharuddin; Scott C. Burkhart, Editors, Proceedings of SPIE vol. 7797 (SPIE, Bellingham, WA 2010), 77970F.

Valley et al., "Applications of the orthogonal matching pursuit/nonlinear least squares algorithm to compressive sensing recovery," Applications of Digital Signal Processing, ed. C. Cuadrado-Laborde, Intech, Croatia (2011): 169-190.

Valley et al., "compressive sensing of sparse radio frequency signals using optical mixing," Opt. Lett. 37(22):4675-4677 (2012).

Valley, "Photonic Analog to Digital Converters," Optics Express 15(5):1955-1982 (2007).

Valley et al., "Optical multi-coset sampling of GHz-band chirped signals," Proc. SPIE vol. 9362 93620M-1 (Mar. 14, 2015); [retrieved online on Jul. 29, 2015], from the Internet <URL: http://proceedings.spiedigitallibrary.org/>, pp. 1-7.

Walden, "Analog-to-digital conversion in the early 21st century," Wiley Encyclopedia of Computer Science and Engineering, (edited by Benjamin Wah) Hoboken: John Wiley & Sons, Inc., pp. 1-14 (Sep. 9, 2008).

Wei et al., "New Code Families for Fiber-Bragg-Grating-Based-Spectral-Amplitude-Coding Optical CDMA Systems," IEEE Photonic Technology Letters 13(8):890-892 (2001).

Xiao et al., "Programmable Photonic Microwave Filters With Arbitrary Ultra-Wideband Phase Response," IEEE Trans. Microwave Theory and Technique 54(11):4002-4008 (2006).

Yin et al., "Multifrequency radio frequency sensing with photonics-assisted spectrum compression," Opt. Lett. 38 (21):4386-4388 (2013).

USPTO Non-Final Office Action for U.S. Appl. No. 13/830,826, mailed May 1, 2014 (7 pages).

USPTO Notice of Allowance for U.S. Appl. No. 12/765,721, mailed May 31, 2011 (7 pages).

USPTO Notice of Allowance for U.S. Appl. No. 13/830,826, mailed Aug. 21, 2014 (5 pages).

* cited by examiner

Wavelength = 1558.0 nm

Wavelength = 1566.5 nm

SYSTEMS AND METHODS FOR CONVERTING RADIO FREQUENCY SIGNALS INTO THE DIGITAL DOMAIN USING MULTI-MODE OPTICS

STATEMENT OF GOVERNMENT INTEREST

This invention was made with government support under Contract No. FA8802-14-C-0001 awarded by the Department of the Air Force. The government has certain rights in the invention.

FIELD OF THE INVENTION

This application generally relates to systems and methods for converting signals, such as radio frequency signals, into the digital domain.

BACKGROUND OF THE INVENTION

An analog-to-digital converter (ADC) is a device that converts continuous analog signals to discrete digital numbers. Generally, an ADC samples an input signal at a predetermined sampling rate calculated using the Nyquist-Shannon Sampling Theorem. Under that theorem, perfect reconstruction of a continuous time signal can be obtained if the sampling rate is greater than twice the highest frequency of the signal. Sampling at twice the highest frequency may, however, not be possible, especially for wideband signals or the resolution (effective number of bits) obtained at this rate may not be sufficient. A wideband signal can be defined as a signal operating at a wide range of frequencies, e.g., above 1 GHz. For these reasons, previously known ADCs may be inadequate to handle wideband applications in, for example, electronic warfare, radar, cognitive radio, signals intelligence, telecommunications, and signal sampling in space. Moreover, previously known ADCs rely on high-speed, high-power electronics that can be cumbersome, power-hungry, and expensive.

SUMMARY OF THE INVENTION

Embodiments of the present invention provide systems and methods for converting signals, such as radio-frequency (RF) signals into the digital domain using multi-mode optics. For example, a wideband analog signal, such as an RF signal, can be imposed onto an optical carrier, processed in the optical domain using one or more multi-mode optical elements, and converted to the electronic domain so as to convert the wideband analog signal into a digital signal using relatively low cost, relatively low data rate, and relatively low power analog-to-digital converters (ADCs). In some embodiments, such conversion and processing is performed using multi-mode guided-wave optical elements, so as to reduce or avoid the need for high-bandwidth electronics as well as free-space optics, although in other embodiments a multi-mode free-space optical element can be used. The elements of the system suitably can be integrated into a unitary platform, e.g., with some or all components of the system integrated onto one or more suitable substrates.

Under one aspect, a method is provided for obtaining a digital representation of a radio-frequency signal. The method can include inputting into a multi-mode optic the radio-frequency signal imposed on an optical carrier. The method also can include outputting by the multi-mode optic a speckle pattern based on the radio-frequency signal imposed on the optical carrier. The method further can include obtaining the digital representation of the radio-frequency signal based on the speckle pattern.

In some embodiments, the multi-mode optic includes a multi-mode guided-wave optic. In some embodiments, the multi-mode guided-wave optic includes a fiber. In some embodiments, the multi-mode guided-wave optic includes a planar waveguide.

In some embodiments, the optical carrier includes a chirped optical pulse.

In some embodiments, the method further includes irradiating an optical sensor with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern. In some embodiments, the multi-mode optic imposes the optical intensity profile on the first portion of the speckle pattern as a function of wavelength of the optical carrier upon which the radio-frequency signal is imposed. In some embodiments, the optical intensity profiles of at least the first and second portions of the speckle pattern define a mixing matrix. In some embodiments, the method further includes obtaining a digitized electrical output of the optical sensor, the digital representation being obtained based at least on the digitized electrical output and the mixing matrix.

Under another aspect, a system is provided for obtaining a digital representation of a radio-frequency signal. The system can include a multi-mode optic configured to receive the radio-frequency signal imposed on an optical carrier and to output a speckle pattern based on the radio-frequency signal imposed on the optical carrier. The system also can include a signal recovery processor configured to obtain the digital representation of the radio-frequency signal based on the speckle pattern.

In some embodiments, the multi-mode optic includes a multi-mode guided-wave optic. In some embodiments, the multi-mode guided-wave optic includes a fiber. In some embodiments, the multi-mode guided-wave optic includes a planar waveguide.

In some embodiments, the optical carrier includes a chirped optical pulse.

In some embodiments, the system further includes an optical sensor configured to be irradiated with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern. In some embodiments, the multi-mode optic imposes the optical intensity profile on the first portion of the speckle pattern as a function of wavelength of the optical carrier upon which the radio-frequency signal is imposed. In some embodiments, the optical intensity profiles of at least the first and second portions of the speckle pattern define a mixing matrix. In some embodiments, the system further includes circuitry configured to obtain a digitized electrical output of the optical sensor, the signal recovery processor being configured to obtain the digital representation based at least on the digitized electrical output and the mixing matrix.

Under still another aspect, an integrated system is provided for obtaining a digital representation of a radio-frequency signal. The integrated system can include a substrate; a receiver configured to receive the radio-frequency signal; a source of an optical carrier; and a modulator configured to impose the radio-frequency signal onto the optical carrier.

The system further can include a multi-mode optic defined within the substrate and configured to receive the optical carrier having the radio-frequency signal imposed thereon and to output a speckle pattern based on the optical carrier having the radio-frequency signal imposed thereon. The system further can include an optical sensor configured to be irradiated with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern. The system further can include a signal recovery processor coupled to the optical sensor and configured to obtain the digital representation of the radio-frequency signal based on at least the first portion of the speckle pattern.

In some embodiments, the receiver, the source, the modulator, and the optical sensor are defined in or disposed on the substrate.

DETAILED DESCRIPTION

Embodiments of the present invention include systems and methods for obtaining a digital representation of a radio frequency (RF) signal using multi-mode optics. The RF signal can be converted into the optical domain, e.g., imposed on an optical carrier, such as but not limited to a chirped optical pulse. A multi-mode optic can receive the RF signal imposed on the optical carrier, and based thereon can output a speckle pattern. The RF signal can be recovered, e.g., converted into the digital domain, based upon the speckle pattern. In some embodiments, different, spatially separated portions of the speckle pattern can define a mixing matrix such as can be used in compressive sensing. For example, components of the optical carrier upon which the RF signal is imposed can interfere with one another as they traverse the length of the multi-mode optic. As a result, a first portion (subset) of the speckle pattern at the output of the multi-mode optic can have an optical intensity profile as a function of wavelength that is different than an optical intensity profile of a second portion (subset) of the speckle pattern that is spatially separated from the first portion of the speckle pattern. The imposition of different optical intensity profiles of different, spatially separated portions of the speckle pattern can be considered to correspond to multiplying replicas of the RF signal imposed on the optical carrier by elements of a mixing matrix. An optical sensor can be irradiated by the first portion of the speckle pattern, and can integrate the optical intensity profile of that portion as a function of time, or, equivalently, wavelength of the optical carrier. The integration of the optical intensity profile of that portion can be considered to correspond to obtaining an element of a measurement vector, based upon which a compressive sensing algorithm can recover the RF signal using knowledge of the mixing matrix, e.g., based on a prior calibration of integrated optical intensity profiles of different, spatially separated portions of the speckle pattern.

An overview of exemplary systems for obtaining digital representations of RF signals using multi-mode optics will be described, along with exemplary signals that can be formed therein. An exemplary method for obtaining digital representations of signals will be described. Additionally, some illustrative performance characteristics of exemplary multi-mode optics suitable for use in the present systems and methods will be described.

Figure 1A:
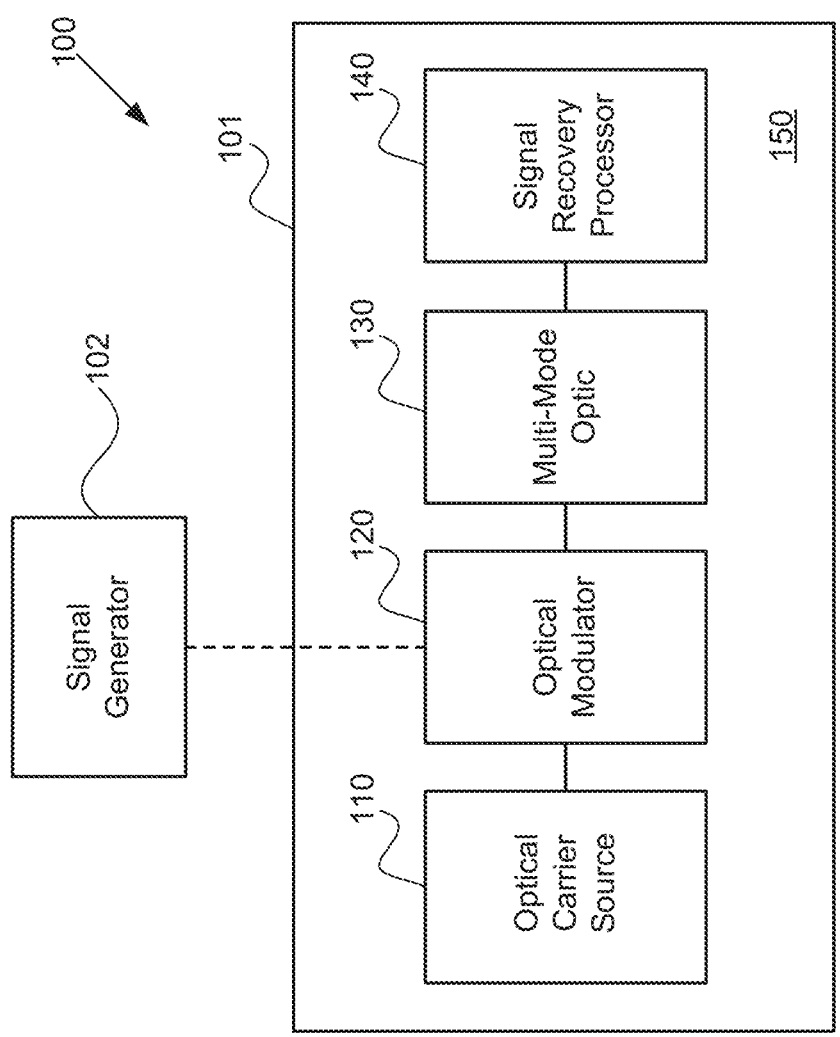
FIGS. 1A-1D schematically illustrate exemplary systems for obtaining a digital representation of a radio-frequency (RF) signal using multi-mode optics, according to some embodiments of the present invention.
Figure 1B:
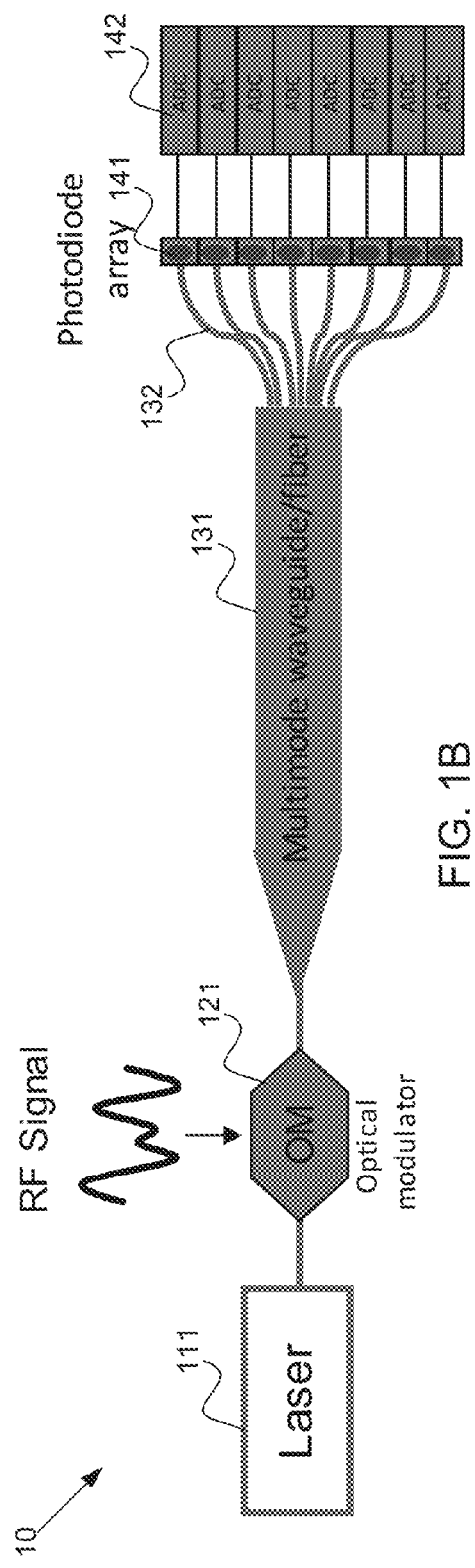

FIG. 1A schematically illustrates a first exemplary system 100 for obtaining a digital representation of an RF signal using a multi-mode optic, according to some embodiments of the present invention. System 100 includes optical carrier source 110, optical modulator 120 coupled to signal generator 102, multi-mode optic 130, signal recovery processor 140, and substrate 150. In some embodiments, system 100 includes housing 101 configured to hold at least optical carrier source 110, optical modulator 120, multi-mode optic 130, and signal recovery processor 140 as illustrated in FIG. 1A. In some embodiments, any suitable number of optical carrier source 110, optical modulator 120, multi-mode optic 130, and signal recovery processor 140, e.g., some or all of optical carrier source 110, optical modulator 120, multi-mode optic 130, and signal recovery processor 140, can be integrated on substrate 150, e.g., can be disposed on or defined in substrate 150. In one non-limiting example, optical carrier source 110, optical modulator 120, multi-mode optic 130, and at least a portion of signal recovery processor 140 optionally can be disposed on a common substrate 150 (such as an indium phosphate, silicon, silica, or lithium niobate wafer) with one another. Optical carrier source 110, optical modulator 120, multi-mode optic 130, and signal recovery processor 140 can be in operable communication with one another via guided-wave optical elements, such as waveguides or optical fibers, that optionally can be defined within or disposed on the common substrate. In other embodiments, system 100 includes more than one housing 101 or more than one substrate 150, each housing or substrate configured to hold at least one structure in system 100. Exemplary configurations of multi-mode optic 130 are provided herein, e.g., with reference to FIGS. 1B-1D.

Figure 2A:
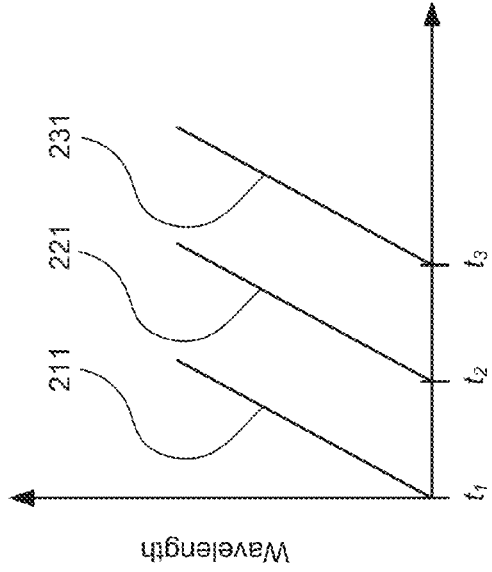
FIG. 2A is a plot illustrating the temporal variations in intensity of three exemplary chirped repetitively pulsed optical signals that can be generated by an optical carrier source.

Optical carrier source 110 illustrated in FIG. 1A can be configured to generate an optical carrier upon which the RF signal to be converted can be imposed. In some embodiments, the optical carrier can include at least one wavelength, e.g., can include a single-frequency laser beam or a multi-frequency laser beam. In some embodiments, the optical carrier can include a plurality of wavelengths, such as an optical pulse, e.g., a chirped optical pulse. For example, the optical carrier can, but need not necessarily, include a chirped, repetitively pulsed optical signal. As used herein, a chirped, repetitively pulsed optical signal is intended to mean a sequence of chirped optical pulses that together have a relatively constant intensity as a function of time and have periodic temporal wavelength variations. FIG. 2A is a plot illustrating the temporal variations in intensity of three exemplary chirped pulses that can be generated by optical carrier source 110 and together can form a chirped, repetitively pulsed optical signal that has a substantially continuous overall intensity in time, as represented by $I_{overall}$. FIG. 2A illustrates three chirped pulses 210, 220, 230 within the signal that begin at times $t_1$, $t_2$, and $t_3$, respectively. After a chirped pulse begins, its intensity increases over time until the intensity levels off at a plateau, e.g., at $I_{overall}$. Chirped pulses 210, 220, 230 can have substantially the same energy as one another and can overlap slightly in the temporal domain. For example, the intensity of pulse 210 begins to decrease after time $t_2$, when pulse 220 begins. Pulses 210 and 220 overlap slightly after time $t_2$, after which the intensity of pulse 210 decreases to zero and the intensity of pulse 220 increases to $I_{overall}$. Preferably, when the pulses overlap, the sum of their intensities is approximately equal to $I_{overall}$. As used herein, the terms "approximately" and "about" mean within 10% of the stated value.

Figure 2B:
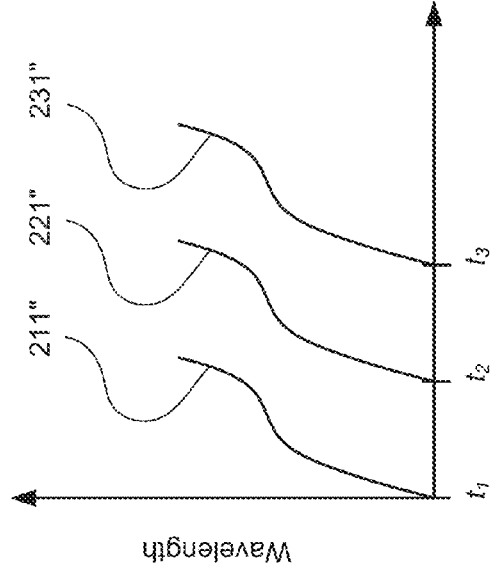
FIGS. 2B-2D are plots illustrating temporal variations in wavelength of three exemplary chirped repetitively pulsed optical signals that can be generated by an optical carrier source, e.g., the temporal wavelength variations of the three chirped repetitively pulsed optical signals illustrated in FIG. 2A.

FIG. 2B is a plot illustrating the temporal variations in wavelength of three exemplary chirped pulses that can be generated by optical carrier source 110, e.g., the temporal wavelength variations of the three chirped pulses 210, 220, 230 illustrated in FIG. 2A. For example, chirped pulses 210, 220, 230 respectively can have temporal wavelength profiles 211, 221, 231 which, as illustrated in FIG. 2B, can begin at times $t_1$, $t_2$, $t_3$ and overlap slightly with one another in the temporal domain. To generate temporal wavelength profiles 211, 221, 231, an optical component such as dispersion compensating fiber or a chirped grating, e.g., a chirped fiber Bragg grating (CFBG), can be arranged so that the short-wavelength components of the optical pulse travel a shorter path than do the long-wavelength components. After transmission through or reflection from the grating, the optical pulse becomes linearly positively chirped, that is, the long-wavelength components lag behind the short-wavelength components in time in a linear manner.

Figure 2C:
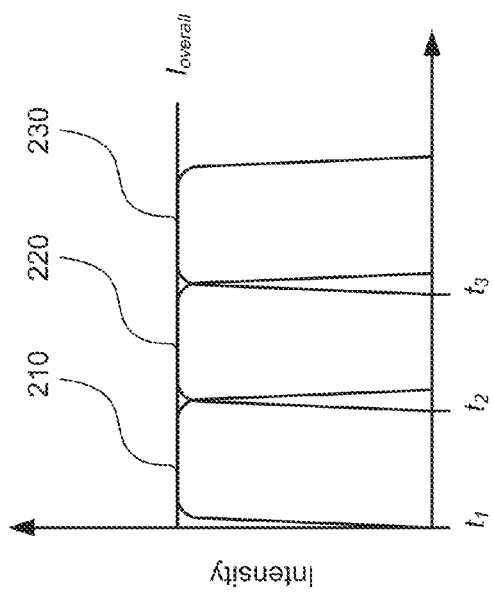

FIG. 2C is a plot illustrating the temporal variations in wavelength of three exemplary linearly negatively chirped pulses that can be generated by optical carrier source 110, e.g., the temporal wavelength variations of the three pulses 210, 220, 230 illustrated in FIG. 2A. In this example, chirped pulses 210, 220, 230 respectively can have temporal wavelength profiles 211', 221', 231' which, as illustrated in FIG. 2C, can begin at times $t_1$, $t_2$, $t_3$ and overlap slightly with one another in the temporal domain. To generate temporal wavelength profiles 211', 221', 231', an optical component such as dispersion compensating fiber or a chirped grating, e.g., a CFBG, can be arranged so that the long-wavelength components of the optical pulse travel a shorter path than do the short-wavelength components. After transmission through the optical component, the optical pulse becomes negatively chirped, that is, the short-wavelength components lag behind the long-wavelength components in time in a linear manner.

Figure 2D:
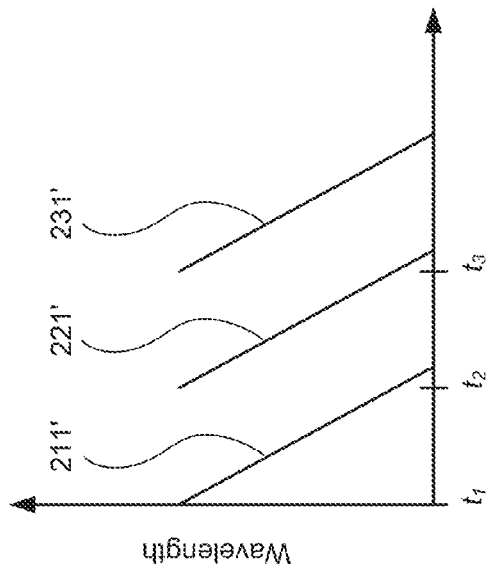

FIG. 2D is a plot illustrating the temporal variations in wavelength of three exemplary nonlinearly positively chirped pulses that can be generated by optical carrier source 110, e.g., the temporal wavelength variations of the three pulses 210, 220, 230 illustrated in FIG. 2A. In this example, chirped pulses 210, 220, 230 respectively can have temporal wavelength profiles 211", 221", 231" which, as illustrated in FIG. 2D, are positively chirped in a manner analogous to that illustrated in FIG. 2B, but have wavelengths that vary nonlinearly with time. Optical components such as CFBGs for either positively or negatively nonlinearly chirping optical pulses are known.

Referring again to FIG. 1A, optical carrier source 110 can include a laser, such as a continuous-wave laser configured to generate a single frequency, or a suitably pulsed laser, such as a mode-locked laser, fiber laser, titanium-doped sapphire (Ti: Sapphire) solid-state laser, diode laser, or dye laser, or any other suitable optical source. In some embodiments, the laser can be configured so as to generate an optical pulse including a plurality of wavelengths, e.g., at least one chirped optical pulse, and optionally so as to generate a chirped, repetitively pulsed optical signal, without the need for an additional optical component. Alternatively, a separate optical component can be provided for chirping an optical pulse (or a repetitive sequence of such pulses) generated by a laser or other suitable optical source. Such an optical component can include a guided-wave optical component, and can include, for example, a grating such as a chirped FBG, a dispersion compensating fiber (DCF), or a standard optical fiber. In embodiments in which optical carrier source 110 includes a pulsed laser, the laser can be transform-limited, so as to produce ultrafast pulses (e.g., 1 picosecond at full width at half maximum (FWHM) or less) at a high bandwidth (e.g., 10 nm at FWHM or more), and the optical component can be configured to temporally disperse the bandwidth of at least one of those pulses, and optionally to temporally disperse each of those pulses such that the pulses temporally overlap with one another, resulting in a substantially uniform overall intensity $I_{overall}$ such as illustrated in FIG. 2A. In some embodiments, the pulsed laser can have a repetition rate of at least 1 MHz, or at least 10 MHz, or at least 100 MHz, or at least 1 GHz, resulting in a suitable interpulse period (time difference between $t_2$ and $t_1$, and between $t_3$ and $t_2$). For example, a pulsed laser with a repetition rate of about 100 MHz has an interpulse period of about 10 ns. In some embodiments, optical carrier source 110 is a femtosecond (fs) class laser configured to generate laser pulses having a FWHM in the range of 1 fs to 1000 fs, e.g., between 10 fs to 100 fs at FWHM, optionally associated with a chirped FBG configured to positively linearly or negatively linearly chirp and temporally disperse the pulses in a manner analogous to that illustrated in FIGS. 2A-2C. Additional exemplary sources for the optical carrier source 110 can include, but are not limited to, an optical comb source, a time and wavelength interleaved optical source, and a supercontinuum source.

In one illustrative embodiment, optical carrier source 110 can include a theta laser such as disclosed in Shinwook Lee et al., *Extreme Chirped Pulse Oscillator (XCPO) Using a Theta Cavity Design*, IEEE Photonics Technology Letters, Vol. 18, No. 7, 799-801 (Apr. 1, 2006), the entire contents of which are incorporated by reference herein. The theta laser disclosed in Lee includes two optical circulators, an intensity modulator, an output coupler, a bandpass filter, a polarization controller, a semiconductor optical amplifier, an electric comb generator, and chirped FBG. The theta laser can be used to generate a sequence of chirped optical pulses.

Signal generator 102 is coupled to optical modulator 120, and can be configured to generate a signal such as an analog radio-frequency (RF) or digital RF signal. Signal generator 102 can be any device capable of generating a signal, which signal can be received from another component. For example, signal generator 102 can include an antenna configured to receive a remotely generated RF signal and to provide that RF signal to optical modulator 120, e.g., via a wired or wireless signaling pathway (not illustrated). Signal generator 102 is suitably coupled to optical modulator 120 such that modulator 120 can impose the RF signal upon the optical carrier generated by optical carrier source 110. Signal generator 102 need not necessarily be considered to be part of system 100, and indeed can be remote from system 100.

The RF signal generated by signal generator 102 can be wideband, e.g., can have a bandwidth of 1 GHz or greater, and can be analog, and the RF signal's characteristics (e.g., modulation format) and the information content of the RF signal can be unknown. In some embodiments, signal generator 102 generates an analog RF signal. The analog RF signal can be "sparse" under a known transformation, e.g., a Fourier or wavelet transformation. In the frequency domain, a signal can be defined to be "sparse" if it includes, or consists essentially of, or consists of, a relatively small number of narrowband transmissions spread across a relatively wide spectrum range. A sparse signal can be represented by a vector, e.g., a vector having dimension N×1, having a relatively small number of nonzero elements.

Figure 3:
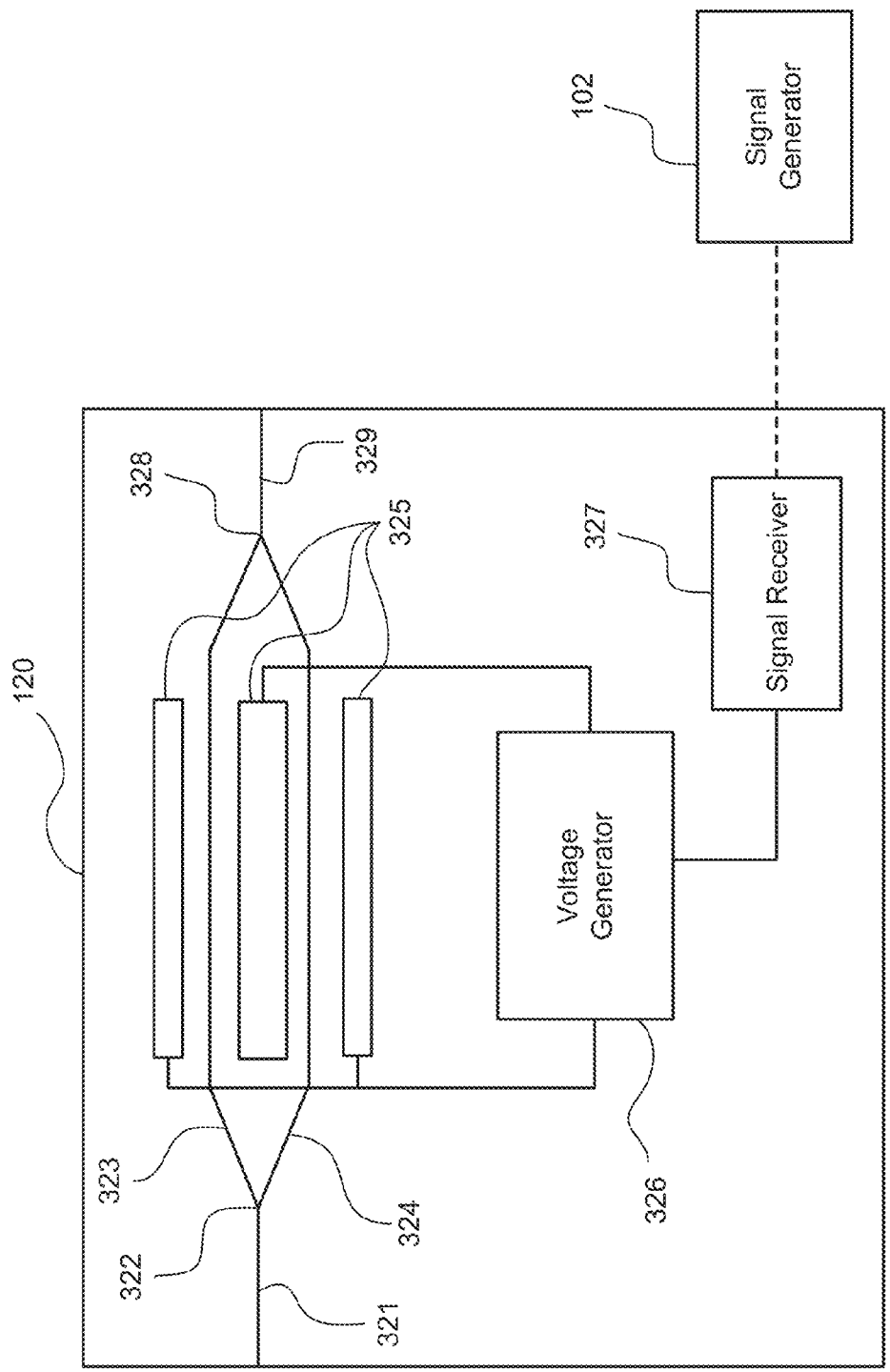
FIG. 3 schematically illustrates an exemplary optical modulator configured to impose an RF signal on an optical carrier, according to some embodiments of the invention.

Optical modulator 120 can be configured to impose the RF signal, e.g., RF analog signal, onto the optical carrier generated by optical carrier source 110. For example, FIG. 3 schematically illustrates an exemplary optical modulator 120 that is based on guided-wave optics and is configured to receive an RF signal from signal generator 102, and to impose the received RF signal on the optical carrier by modulating the intensity of the optical carrier, according to some embodiments of the invention. Optical modulator 120 illustrated in FIG. 3 includes input optical fiber or waveguide 321, electrodes 325, voltage generator 326, signal receiver 327, and output optical fiber or waveguide 329. An optical carrier, such as a chirped optical pulse or a chirped, repetitively pulsed optical signal, from optical carrier source 110 is introduced to optical modulator 120 through input optical fiber or waveguide 321. Junction 322 divides that optical carrier into two portions and respectively guides the portions into sections 323 and 324, each of which can be defined with guided-wave optics such as an optical fiber or waveguide. Electrodes 325 are positioned on either side of sections 323, 324. Voltage generator 326 can be programmed to independently apply voltages to different pairs of electrodes 325 so as to change the phase of the optical carrier portion traveling through the section adjacent to that pair. For example, voltage generator 326 can apply voltages proportional to the signal generated by signal generator 102 and received by signal receiver 327. Signal receiver 327 can be operatively coupled to voltage generator 326 and can be any structure capable of receiving an RF signal such as an analog RF signal, e.g., an antenna.

In optical modulator 120 illustrated in FIG. 3, the two portions of the optical carrier in sections 323, 324 can recombine at junction 328 where they interfere with one another. Because the relative phase of the optical carrier portions traveling through sections 323, 324 can be controlled via voltage generator 326, the intensity of the recombined optical carrier at junction 328 can be modulated based on the signal received by signal receiver 327. For example, if the portion of the optical carrier in section 323 is phase-delayed by an even multiple of π relative to that in section 324, then when recombined at junction 328 the two portions of the optical carrier constructively interfere with each other, yielding maximum brightness. Or, for example, if the portion of the optical carrier in section 323 is phase-delayed by an odd multiple of π relative to that in section 324, then when recombined at junction 328 the two portions destructively interfere with each other, yielding minimal brightness. The output of optical modulator 120 includes the RF signal imposed as an intensity modulation on the optical carrier. This output is coupled into a single output optical fiber or waveguide 329. Configurations such as that illustrated in FIG. 3 can be referred to as a Mach-Zehnder modulator (MZM), and can be implemented in a suitable substrate such as lithium niobate or indium phosphate (InP), in which waveguides can be provided that define input 321, junction 322, sections 323 and 324, junction 328, and output 329. Other modulators, such as absorptive modulators based on the Franz-Keldysh effect or the quantum confined Stark effect, or other interferometric modulators, can also suitably be used.

Figure 4:
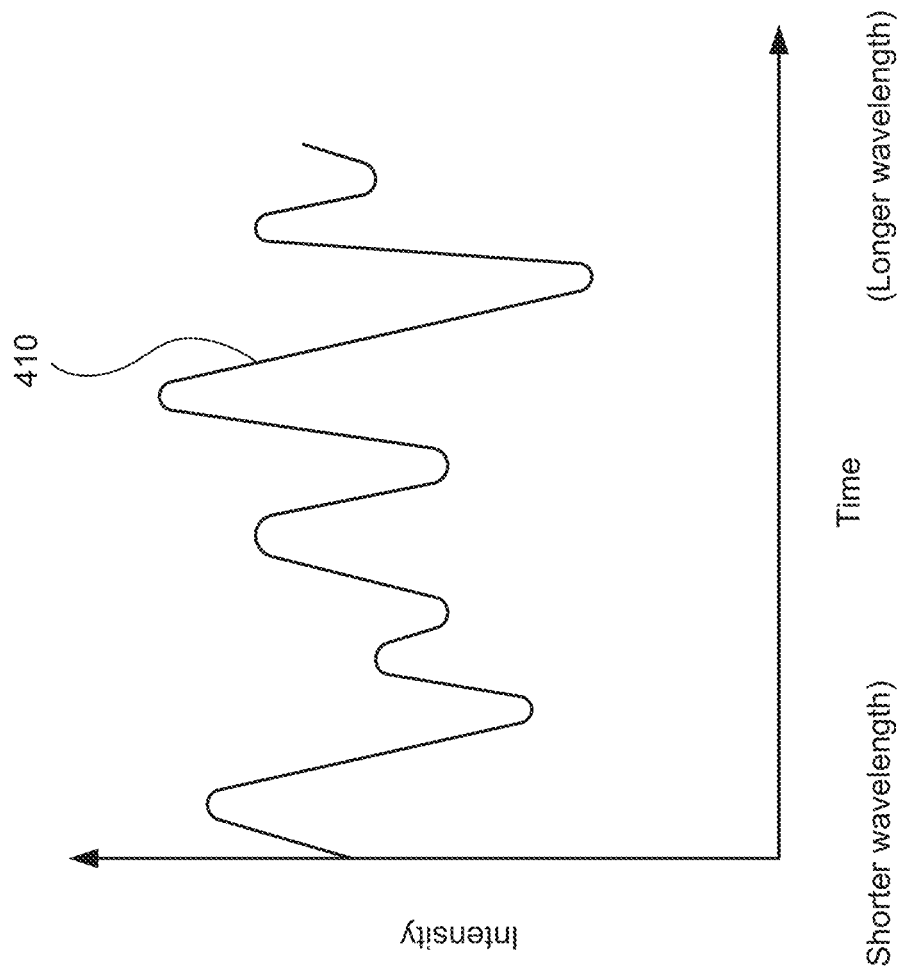
FIG. 4 is a plot illustrating a temporal intensity profile of an exemplary RF signal imposed on an optical carrier, such as a chirped optical pulse.

FIG. 4 is a plot illustrating temporal intensity profile 410 of an exemplary RF signal imposed on an optical carrier, e.g., a chirped optical pulse, by optical modulator 120. Temporal intensity profile 410 has varying intensities corresponding to imposition of an RF signal onto the chirped optical pulse. In this example, the optical pulse is positively chirped, that is, the long-wavelength component lags behind the short-wavelength component in time. The optical pulse instead could be negatively chirped. In other embodiments, the optical carrier can include a single-frequency continuous-wave laser beam, the frequency of which is modified by the frequency of the RF signal.

Referring back to FIG. 1A, multi-mode optic 130 receives from optical modulator 120 the RF signal imposed on the optical carrier. Multi-mode optics can include guided-wave optics and free-space optics. In some embodiments, multi-mode optic 130 includes a multi-mode guided-wave optic. For example, the multi-mode guided-wave optic can include a fiber, or a planar waveguide. In some embodiments, multi-mode optic 130 can include an aberrator and free-space propagation to produce the speckle pattern. Exemplary characteristics of multi-mode optics 130 are provided below with reference to FIGS. 9A-9D, 10A-10B, and 11A-11B.

Multi-mode optic 130 is configured so as to output a speckle pattern based on the RF signal imposed on the optical carrier. By "multi-mode optic" it is meant a passive optical component that supports a plurality of electromagnetic propagation modes for each of a plurality of wavelengths, in which different of such propagation modes coherently interfere with one another so as to produce a speckle pattern. By "speckle pattern" it is meant an irregular, aperiodic pattern in which at least a first portion of the pattern includes an optical intensity profile that is different than an optical intensity profile of at least a second portion of the pattern that is spatially separated from the first portion of the pattern. By "optical intensity profile" it is meant the respective intensities (amplitudes) of different wavelengths in an optical pulse at a selected region of space.

Figure 5A:
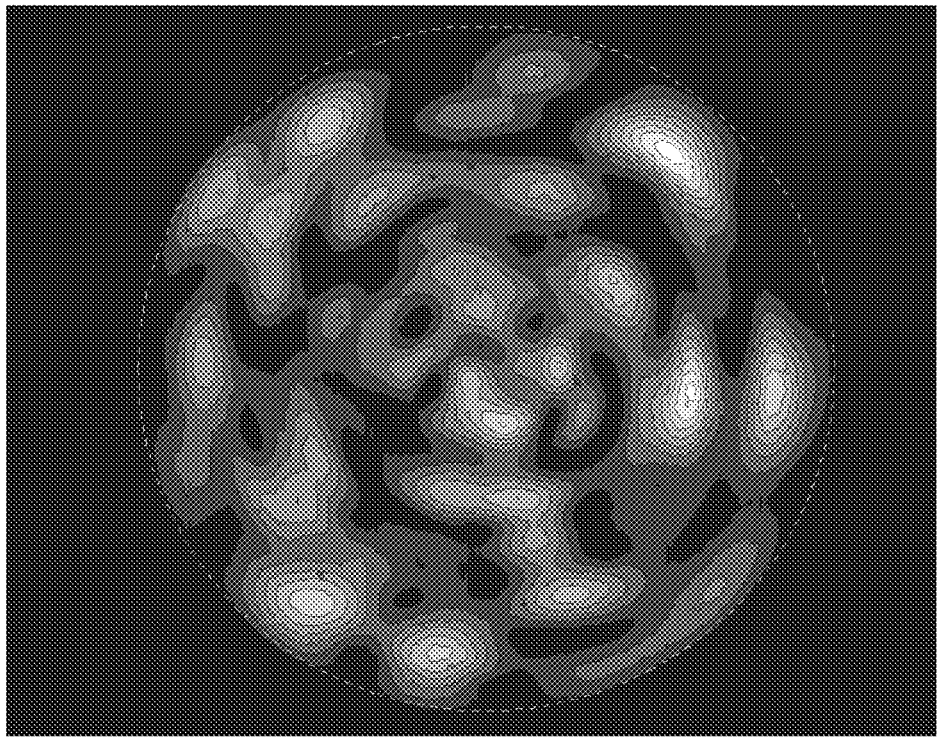
FIG. 5A schematically illustrates an exemplary measured speckle pattern generated by a multi-mode optic at a first wavelength of an optical carrier, e.g., a chirped optical pulse, according to some embodiments of the present invention.
Figure 5B:
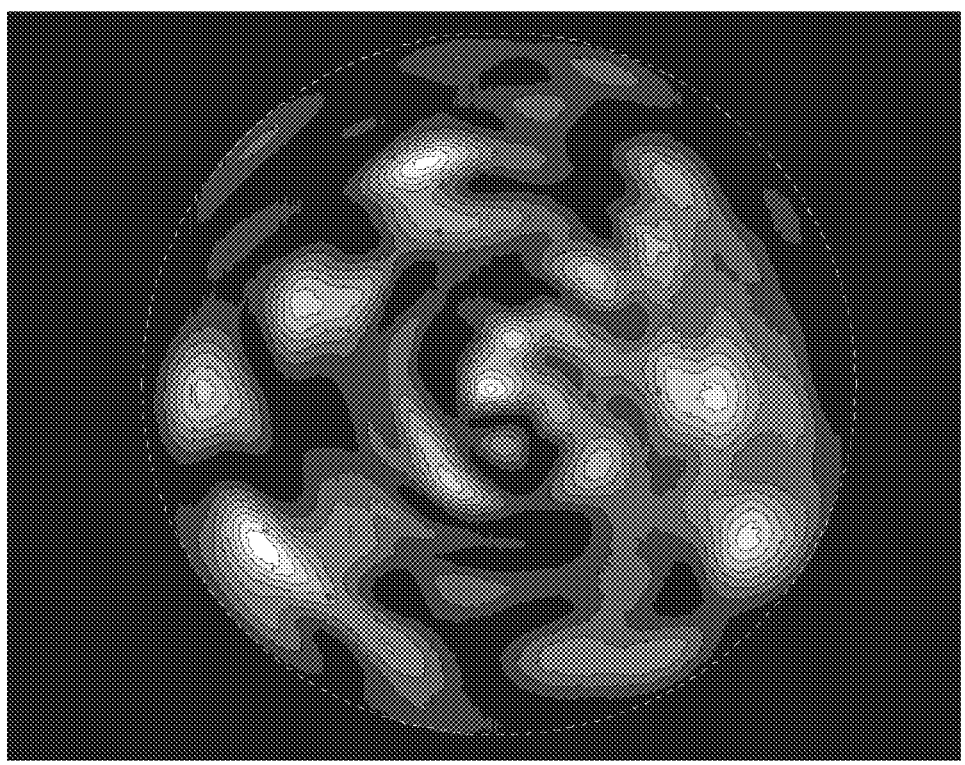
FIG. 5B schematically illustrates an exemplary measured speckle pattern generated by a multi-mode optic at a second wavelength of an optical carrier, e.g., a chirped optical pulse, according to some embodiments of the present invention.

Accordingly, within a speckle pattern output by multi-mode optic 130 illustrated in FIG. 1A, a first wavelength in a first portion of the pattern can have a different intensity than does a second wavelength in the first portion of the pattern, and also can have a different intensity than does the first wavelength in a second portion of the pattern. For example, FIGS. 5A-5B schematically illustrate exemplary measured speckle patterns generated by a multi-mode optic at respective first and second wavelengths of an optical carrier, e.g., a chirped optical pulse, according to some embodiments of the present invention. The exemplary speckle patterns illustrated in FIGS. 5A-5B were measured for a cylindrical fiber that is 105 microns in core diameter and 1 meter in length. More specifically, a chirped optical pulse including wavelengths from 1539 nm to 1569 nm was input into a 1 meter long multi-mode fiber including a 105 micron diameter core and an 0.22 numerical aperture. In FIGS. 5A and 5B, black corresponds to substantially no intensity, and white corresponds to maximum normalized intensity. It can be seen in FIG. 5A that at a wavelength of 1558.0 nm, the multi-mode fiber (multi-mode guided-wave optic) was measured to output a speckle pattern in which a plurality of portions of the pattern have a different optical intensity at that wavelength than do a plurality of other portions of the pattern at that wavelength. It can be seen in FIG. 5B that at a wavelength of 1566.5 nm, the multi-mode fiber (multi-mode guided-wave optic) was measured to output a speckle pattern in which a plurality of portions of the pattern have a different optical intensity at that wavelength than do a plurality of other portions of the pattern at that wavelength. Additionally, the pattern at 1558.0 nm (FIG. 5A) is significantly different than the pattern at 1566.5 nm (FIG. 5B).

Figure 6A:
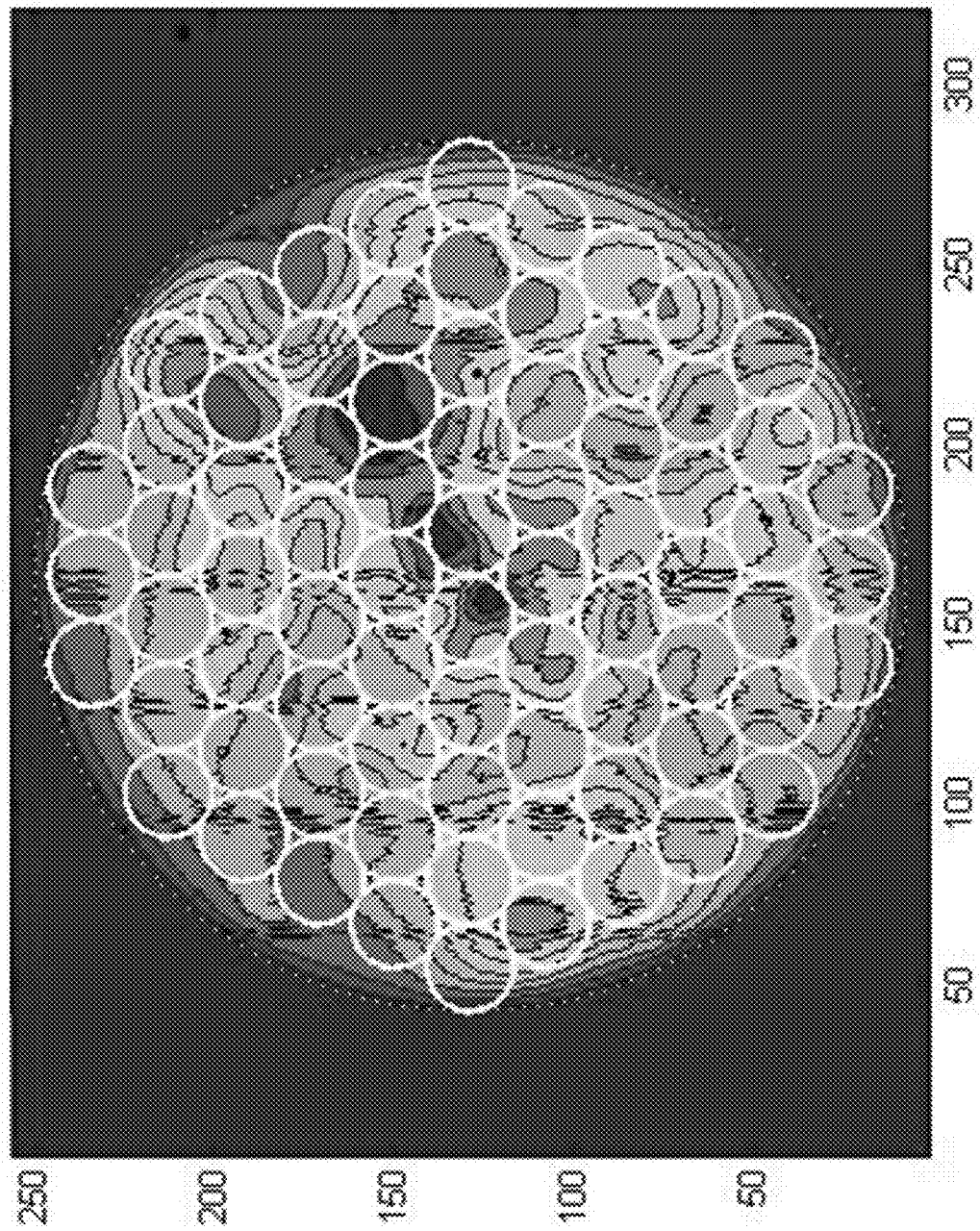
FIG. 6A schematically illustrates an exemplary measured speckle pattern generated by a multi-mode optic across all wavelengths in an optical carrier, e.g., a chirped optical pulse, and exemplary positions for optical sensors configured to be irradiated by different portions of the speckle pattern, according to some embodiments of the present invention.

FIG. 6A schematically illustrates an exemplary measured speckle pattern generated by a multi-mode optic across all wavelengths in an optical carrier, e.g., a chirped optical pulse, and exemplary positions for optical sensors configured to be irradiated by different portions of the speckle pattern, according to some embodiments of the present invention. The exemplary speckle pattern illustrated in FIG. 6A was measured analogously as those illustrated in FIGS. 5A-5B, except that FIG. 6A illustrates accumulated speckle patterns for all of the measured wavelengths, rather than for selected measured wavelengths as for FIGS. 5A-5B. In FIG. 6A, dark blue corresponds to substantially no intensity at the corresponding portion, and dark red corresponds to maximum normalized intensity for the accumulated sum of all wavelengths at the corresponding portion. It can be seen in FIG. 6A that the speckle pattern includes portions of relatively high intensity, particularly in the upper right quadrant, as well as portions of relatively low intensity, particularly around the periphery. The small circles that FIG. 6A illustrates as interposed over the speckle pattern correspond to exemplary positions at which optical sensors, or guided-wave optics coupled to optical sensors, can be disposed so as to irradiate the optical sensors with different, spatially separated portions of the speckle pattern so as to generate electrical signals based upon which the RF signal can be recovered. In the illustrated example, the small circles each are 10.5 μm in diameter, although it should be appreciated that any suitable size and number of such circles, or any other suitable shape, can be used.

Figure 6B:
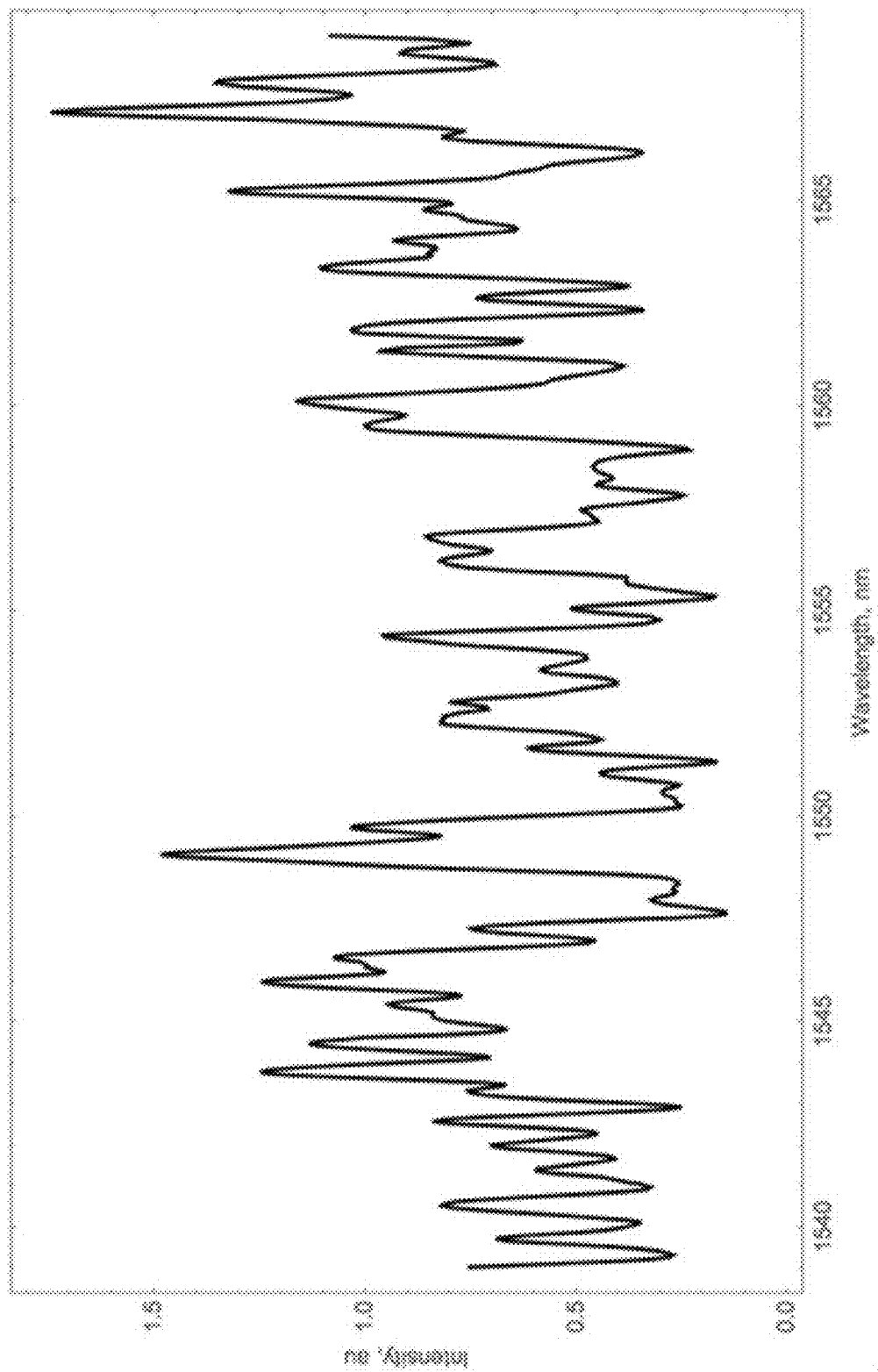
FIG. 6B schematically illustrates an exemplary measured optical intensity profile of a first portion of a speckle pattern such as illustrated in FIG. 6A, according to some embodiments of the present invention.

In some embodiments, the optical intensity profile of at least one portion of the speckle pattern is different than the optical intensity profile of at least one other portion of the speckle pattern. For example, FIG. 6B schematically illustrates an exemplary measured optical intensity profile of a first portion of a speckle pattern, such as within one of the small circles illustrated in FIG. 6A, according to some embodiments of the present invention. The exemplary optical intensity profile illustrated in FIG. 6B was measured analogously as for the speckle patterns illustrated in FIGS. 5A-5B and 6A, except that FIG. 6B illustrates the optical intensity profile for all of the wavelengths at a selected region of the pattern illustrated in FIG. 6A. It can be seen in FIG. 6B that at the selected portion of the pattern (within one of the small circles illustrated in FIG. 6A), different wavelengths can have significantly different intensities than one another, and that the relative intensities of the wavelengths at that portion differ in an irregular, aperiodic way relative to one another.

Figure 6C:
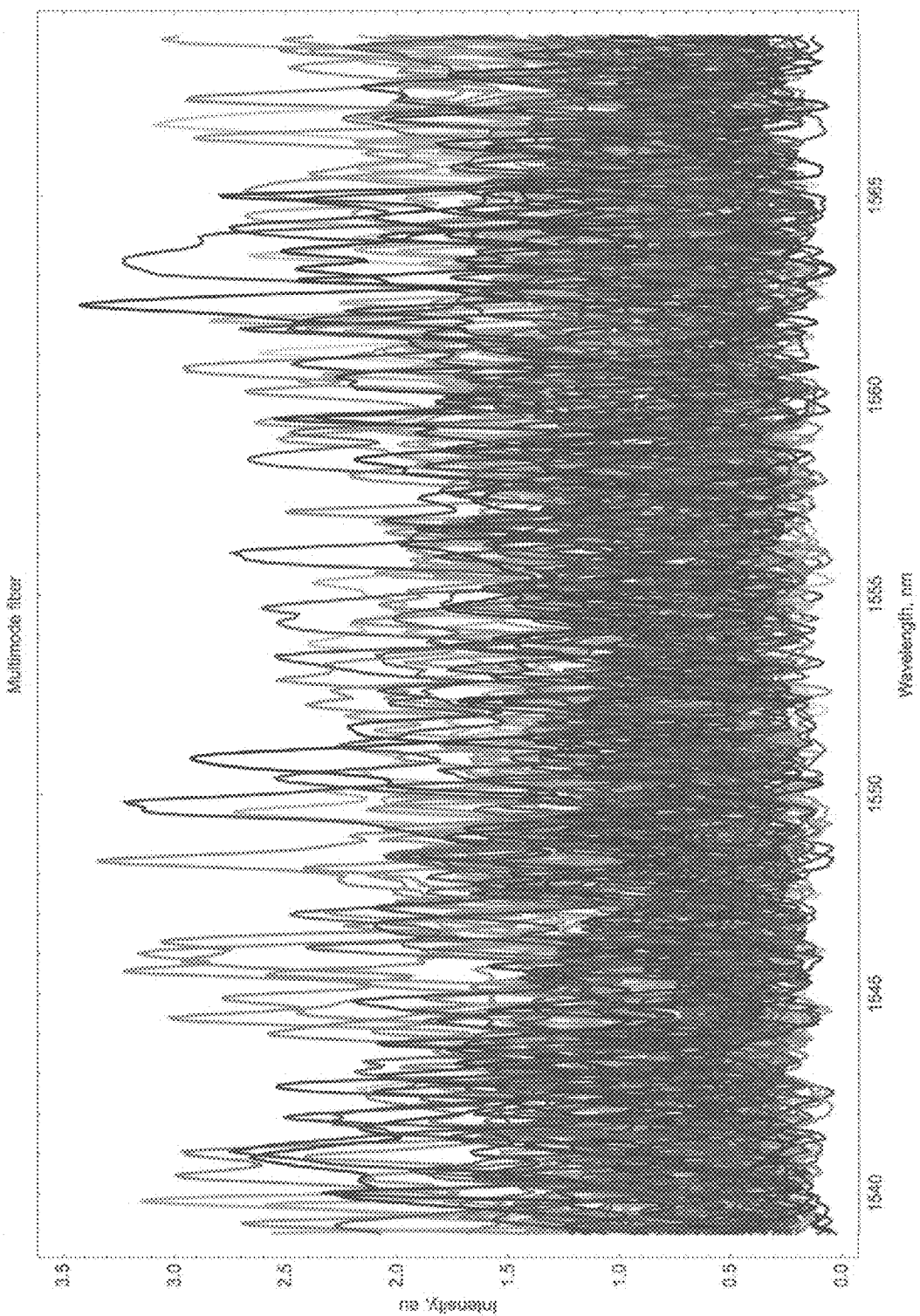
FIG. 6C schematically illustrates exemplary optical intensity profiles of a plurality of different portions of the speckle pattern, according to some embodiments of the present invention.

Different, spatially separated portions of the speckle pattern also can have different intensity profiles than one another. For example, FIG. 6C schematically illustrates exemplary optical intensity profiles of a plurality of different portions of the speckle pattern, according to some embodiments of the present invention. The exemplary optical intensity profile illustrated in FIG. 6C was measured analogously as for the speckle patterns illustrated in FIGS. 5A-5B and 6A, except that FIG. 6C illustrates the optical intensity profile for all of the wavelengths at different portions (different small circles) of the pattern illustrated in FIG. 6A. In FIG. 6C, different colors correspond to the optical intensity profiles within corresponding circles illustrated in FIG. 6A. Because the number of small circles illustrated in FIG. 6A exceeds the number of colors in the palette used to prepare FIG. 6C, each color in FIG. 6C is reused several times to represent respective optical intensity profiles of different portions of the speckle pattern. It can be seen in FIG. 6C that each portion of the speckle pattern (e.g., each small circle illustrated in FIG. 6A) potentially can include each wavelength of the optical carrier, but with different intensities of each wavelength in each portion.

Although FIGS. 6B and 6C are illustrated as showing optical intensity as a function of wavelength for corresponding portions of the speckle pattern, it should be understood that such optical intensities also, equivalently, can be a function of time for such corresponding portions of the speckle pattern. For example, based upon the optical carrier being negatively linearly chirped, multi-mode optic 130 illustrated in FIG. 1A first outputs the longer wavelengths illustrated in FIGS. 6B and 6C, followed by longer wavelengths; accordingly, the optical intensity profile for each portion of the speckle pattern, as a function of time, can appear substantially the same along the x-axis as shown in FIGS. 6B and 6C. As another example, based upon the optical carrier being positively linearly chirped, multi-mode optic 130 illustrated in FIG. 1A first outputs the shorter wavelengths illustrated in FIGS. 6B and 6C, followed by longer wavelengths; accordingly, the optical intensity profile for each portion of the speckle pattern, as a function of time, can appear substantially reverse along the x-axis relative to that shown in FIGS. 6B and 6C.

The RF signal can be recovered based on the speckle pattern. For example, referring again to FIG. 1A, system 100 further can include signal recovery processor 140 configured to obtain a digital representation of the RF signal based on the speckle pattern. In a manner analogous to that described above with reference to FIGS. 5A-6C, a first portion of the speckle pattern can include an optical intensity profile that is different than an optical intensity profile of a second portion of the speckle pattern, and the first portion of the speckle pattern can be spatially separated from the second portion of the speckle pattern. Multi-mode optic 130 imposes the optical intensity profile on the first portion of the speckle pattern as a function of wavelength of the optical carrier upon which the RF signal is imposed. In some embodiments, the optical carrier upon which the RF signal is imposed includes a chirped optical pulse.

Signal recovery processor 140 can include at least one optical sensor that multi-mode optic 130 irradiates with a first portion of a speckle pattern, and that generates an analog electronic signal. Additionally, signal recovery processor 140 can include one or more electronic based devices configured to convert analog signals into digital signals, e.g., an analog-to-digital converter (ADC), for further processing. For example, the optical sensor can be coupled to an ADC so as to digitize an electrical output of the optical sensor. Additionally, signal recovery processor 140 can include any suitable device capable of signal recovery, e.g., a processor, and can include a memory device such as random access memory (RAM), a flash drive, or other recordable medium for storing the output of the ADC(s), as well as the digital representation of the RF signal.

Figure 7:
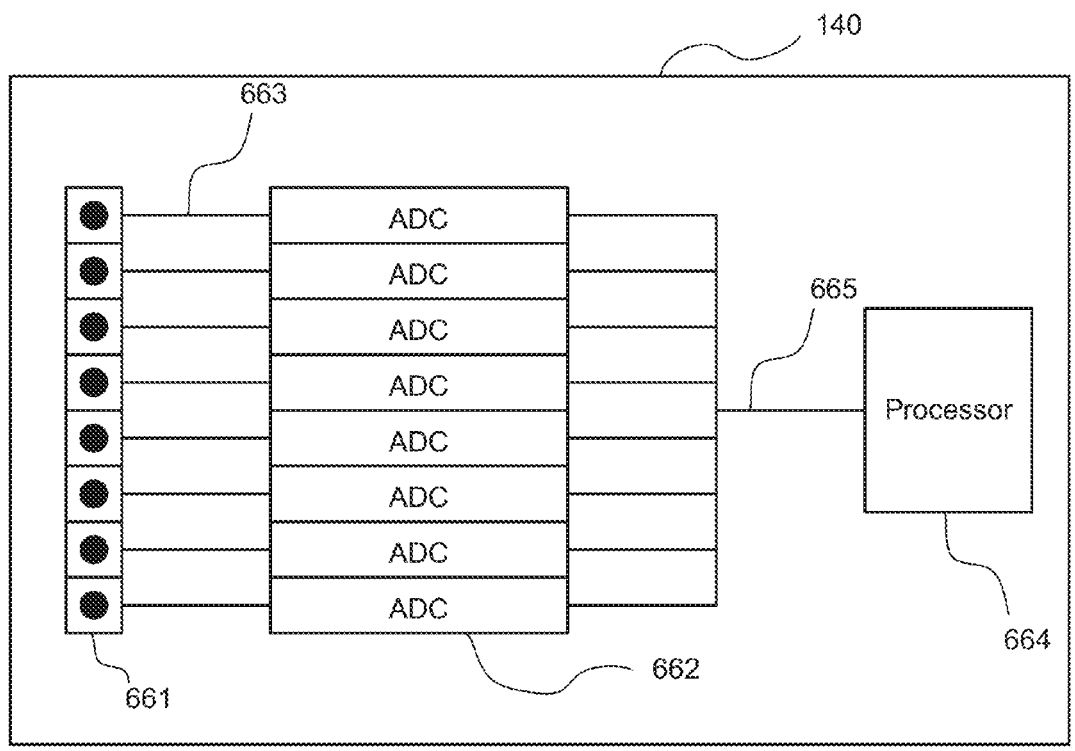
FIG. 7 illustrates components of an exemplary signal recovery processor such as can be used in the systems of any of FIGS. 1A-1D, according to some embodiments of the present invention.

Exemplary signal recovery processor 140 illustrated in FIG. 7 includes M photodetectors (PDs) 661, and M analog-to-digital converters (ADCs) 662. Each photodetector 661 receives a portion of the speckle pattern output by multi-mode optic 130 illustrated in FIG. 1A, either directly or via a guided-wave optical element, such as a waveguide or optical fiber. Photodetectors 661 are illustrated as being arranged linearly, but it should be understood that photodetectors 661 can have any suitable arrangement. For example, each small circle illustrated in FIG. 6A can correspond to a suitable location of an optical sensor, such as a photodetector, or a suitable location of a guided-wave optic that is coupled to an optical sensor so as to provide a corresponding portion of the speckle pattern to the optical sensor. Photodetectors 661 can include any device configured to convert light into current or voltage, such as a photodiode, and by design can include a low-pass filter. Each photodetector 661 can be configured so as to obtain an electronic representation of a portion of the speckle pattern, and provides that electronic representation to a corresponding one of ADCs 662 via a suitable electronic pathway 663, e.g., a conductor. ADC 662 then generates a digital representation of the corresponding portion of the speckle pattern, and provides that digital representation to processor 664 via a suitable electronic pathway 665, e.g., a conductor. In some embodiments, ADCs 662 are synchronized to optical carrier source 110 illustrated in FIG. 1A.

Referring still to FIG. 7, processor 664 can be configured to obtain a digital representation of the RF signal based on the digitized electrical output of the optical sensor and the speckle pattern. In some embodiments, the optical intensity profiles of different portions of the speckle pattern, e.g., at least first and second portions of the speckle pattern, define a mixing matrix based upon which a digital representation of the RF signal can be obtained. For example, as described elsewhere herein, optical modulator 120 imposes the RF signal upon the optical carrier, which then is input into multi-mode optic 130. Each different portion of the speckle pattern that multi-mode optic 130 generates based on the RF signal imposed upon the optical carrier thus includes the entire temporal profile of the RF signal, multiplied by the optical intensity profile of that portion of the speckle pattern as a function of time, or wavelength, or both. As such, each optical intensity profile of a given portion of the speckle pattern can be considered to correspond to a replica of the RF signal, multiplied by elements of a row of a mixing matrix such as used in compressive sensing. For example, the elements of at least one row of the mixing matrix (that is, an optical intensity profile of a corresponding portion of the speckle pattern), are different than the elements of at least one other row of the mixing matrix (that is, is different than an optical intensity profile of at least one other corresponding portion of the speckle pattern). Optical sensors of signal recovery processor 140 can be configured to be irradiated with the light corresponding to at least one of such rows of the mixing matrix, so as to generate an integrated intensity across all of the wavelengths within the corresponding portion of the speckle pattern. For example, an optical sensor 661 irradiated with an optical intensity profile such as illustrated in FIG. 6B or FIG. 6C can generate an output based on the sum of all of the intensities that it receives. Such an integrated intensity can correspond to an element of a measurement vector such as used in compressive sensing. Signal recovery processor 140 can be configured so as to digitize such electrical output (e.g., using ADCs 662) and so as to recover the RF signal based on the digitized electrical output through techniques known in the art of compressive sensing, e.g., using suitable computer software, which can be stored in a volatile or non-volatile memory device within signal recovery processor 140, e.g., RAM, ROM, or flash memory.

As will be familiar to those of ordinary skill in the art, compressive sensing is a methodology for preprocessing sparse data in the analog domain, e.g., an analog signal, prior to digitization in such a way that fewer digital resources, e.g., fewer ADCs, can be used to obtain an accurate representation of the sparse data. See, for example, Candès et al., "An Introduction To Compressive Sampling," IEEE Signal Processing Magazine 25(2): 21-30 (March 2008), the entire contents of which are incorporated by reference herein. In some embodiments, the compressive sensing techniques employed in the systems and methods described herein can use a set of algorithms developed for sampling signals and images at rates much lower than the traditional Nyquist rate. See, for example, Loris, "L1Packv2: A Mathematica package for minimizing an $l_1$-penalized functional," pg. 1-17 (Aug. 20, 2008), the entire contents of which are incorporated by reference herein. Loris discloses the use in compressive sensing of a Mathematica® (Wolfram Research, Champaign, Ill.) package called L1Packv2 that includes an algorithm called FindMinimizer that can be used to obtain a digital representation of the RF signal. Signal recovery processor 140 can use the L1Packv2 package, or any other suitable set of algorithms, to obtain a digital representation of the RF signal based on the mixing matrix and the measurement vector. As another example, see Valley and Shaw, "Applications of the orthogonal matching pursuit/nonlinear least squares algorithm to compressive sensing recovery," *Applications of Digital Signal Processing*, ed. C. Cuadrado-Laborde, Intech, Croatia (2011): 169-190, the entire contents of which are incorporated by reference herein. In some embodiments, signal recovery processor 140 can use software based on the algorithms described by Valley and Shaw to obtain a digital representation of the RF signal based on the mixing matrix and the measurement vector.

Processor 664 illustrated in FIG. 7 is configured to recover a digital representation of the RF signal based on the digitized outputs of photodetectors 661, which digitized outputs respectively can correspond to elements of a measurement vector such as used in compressive sensing, and also based on the optical intensity profiles of portions of the speckle pattern, which can correspond to elements of a mixing matrix such as used in compressive sensing, using compressive sensing techniques known in the art. Processor 664 can be any suitable processing unit configured to perform signal recovery, determining a modulation format, or demodulating a digital signal based on a demodulation format, e.g., a dedicated circuit, a computer, and can be configured to run a program for signal recovery, determining a modulation format, and/or demodulating a digital signal based on a demodulation format in suitable software, e.g., Matlab® (The MathWorks, Inc., Natick, Mass.) or Mathematica® (Wolfram Research, Champaign, Ill.). Processor 664 can be configured obtain the digital representation of the RF signal using known techniques of signal recovery, compressive sensing, and digital demodulation.

In some embodiments, the signal processing implemented by system 100 illustrated in FIG. 1A, using signal recovery processor 140 illustrated in FIG. 7, can digitize the RF signal at an equivalent sampling rate at least N times greater than the sampling rate of any given ADC 662 in signal recovery processor 140, where N is the number of independent wavelengths of the speckle pattern, and thus corresponds to the number independent time samples of the RF signal within the chirp pulse. A system using signal recovery processor 140 illustrated in FIG. 7, which includes eight photodiodes 661, can be used to recover an RF signal with sparsity less than 8. Or, for example, based upon receiving 76 portions of the speckle pattern at the 76 small circles illustrated in FIG. 6A, it can be expected to recover an RF signal with a sparsity less than 76. It will be known to one skilled in the art of compressive sensing that the number of sensors or independent portions of the speckle pattern needed to recover a signal with sparsity is given by approximately K log (N/K). As a result, wideband RF signals can be converted into digital signals using ADCs that can be commercially available at relatively low cost and can have a relatively low data rate (e.g., less than 500 megasamples/second), and relatively low power (e.g., less than 0.1 picojoules per conversion step). In this regard, it should be noted that the sparsity of system 100 suitably can be increased to accommodate more complicated broadband signals of a desired wavelength by increasing M accordingly, that is, by suitably selecting the number of optical sensors accordingly.

Signal recovery processor 140 further can be configured to determine the modulation format of the digital representation of the RF signal, e.g., using suitable computer software stored within a memory device of signal recovery processor 140. Non-limiting examples of analog modulation formats include amplitude modulation, double-sideband modulation, single-sideband modulation, vestigial sideband modulation, quadrature amplitude modulation, angle modulation, frequency modulation, pulse position modulation, and phase modulation. Signal recovery processor 140 can be configured to demodulate the digital representation based on the determined modulation format, e.g., using suitable computer software stored within a memory device of signal recovery processor 140. Indeed, signal recovery processor 140 can be configured both to determine the modulation format and to demodulate the digital representation of the RF signal based on the determined modulation format. Signal recovery processor 140 further can be coupled to a display unit (not illustrated) such as an LED or LCD-based display screen configured to display the digital representation of the RF signal to a user.

Note that any suitable arrangement and types of optical carrier source 110, optical modulator 120, multi-mode optic 130, signal recovery processor 140, and substrate 150 illustrated in FIG. 1A can be used. For example, in system 10 illustrated in FIG. 1B, the optical carrier source can include a laser 111 that generates an optical carrier, e.g., a laser beam including a single frequency or a plurality of frequencies, such as a continuous-wave laser beam or an optical pulse. Such optical carrier is received by optical modulator 121, which imposes an RF signal upon the optical carrier. The optical carrier upon which the RF signal is imposed optionally is chirped, but need not necessarily be chirped, and indeed need not necessarily include more than one optical frequency. The multi-mode optic can include multi-mode waveguide/fiber 131 that receives as input the RF signal imposed upon the optical carrier, and outputs (directly, or indirectly via guided-wave optics 132) a speckle pattern to a signal recovery processor that includes photodiode array 141 and ADCs 142 that can be configured analogously as those discussed above with reference to FIG. 7.

Figure 1C:
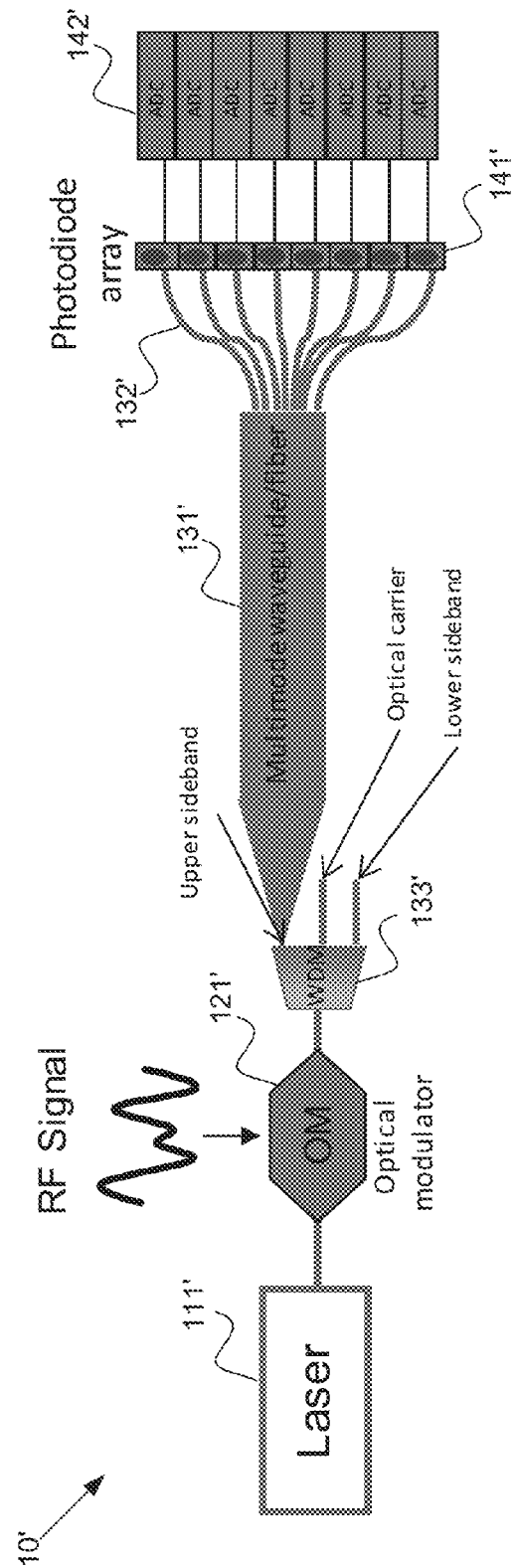

As another example, in system 10' illustrated in FIG. 1C, the optical carrier source can include a laser 111' that generates that generates an optical carrier, e.g., a laser beam including a single frequency or a plurality of frequencies, such as a continuous-wave laser beam or an optical pulse. Such optical carrier is received by optical modulator 121', which imposes an RF signal upon the optical carrier. The optical carrier upon which the RF signal is imposed optionally is chirped, but need not necessarily be chirped, and indeed need not necessarily include more than one optical frequency. The multi-mode optic can include wavelength-division demultiplexer (WDM) 133' that can be configured to receive from optical modulator 121' three signal components: the optical carrier plus the imposed RF signal (upper sideband), the optical carrier minus the imposed RF signal (lower sideband), and the optical carrier alone. WDM 133' can be configured so as to output to multi-mode waveguide/fiber 131' the optical carrier plus the imposed RF signal (upper sideband), and to reject the optical carrier alone and the optical carrier minus the imposed RF signal (lower sideband). Multi-mode waveguide/fiber 131' outputs (directly, or indirectly via guided-wave optics 132') a speckle pattern to a signal recovery processor that includes photodiode array 141' and ADCs 142' that can be configured analogously as those discussed above with reference to FIG. 7. The software in the signal recovery processor can be based on a "dictionary" of vectors of all possible speckle patterns for all possible wavelengths received by the sensor array. The processor can be configured so as to correlate such a dictionary with the measurement vector by performing a dot product of the dictionary matrix with the measurement vector. In some embodiments, the location of the maximum value of the correlation vector corresponds to the location in the dictionary of the most likely speckle pattern and hence to the most likely wavelength received by the sensor array. This wavelength can be related to the sum of the RF frequency plus the optical frequency.

Figure 1D:
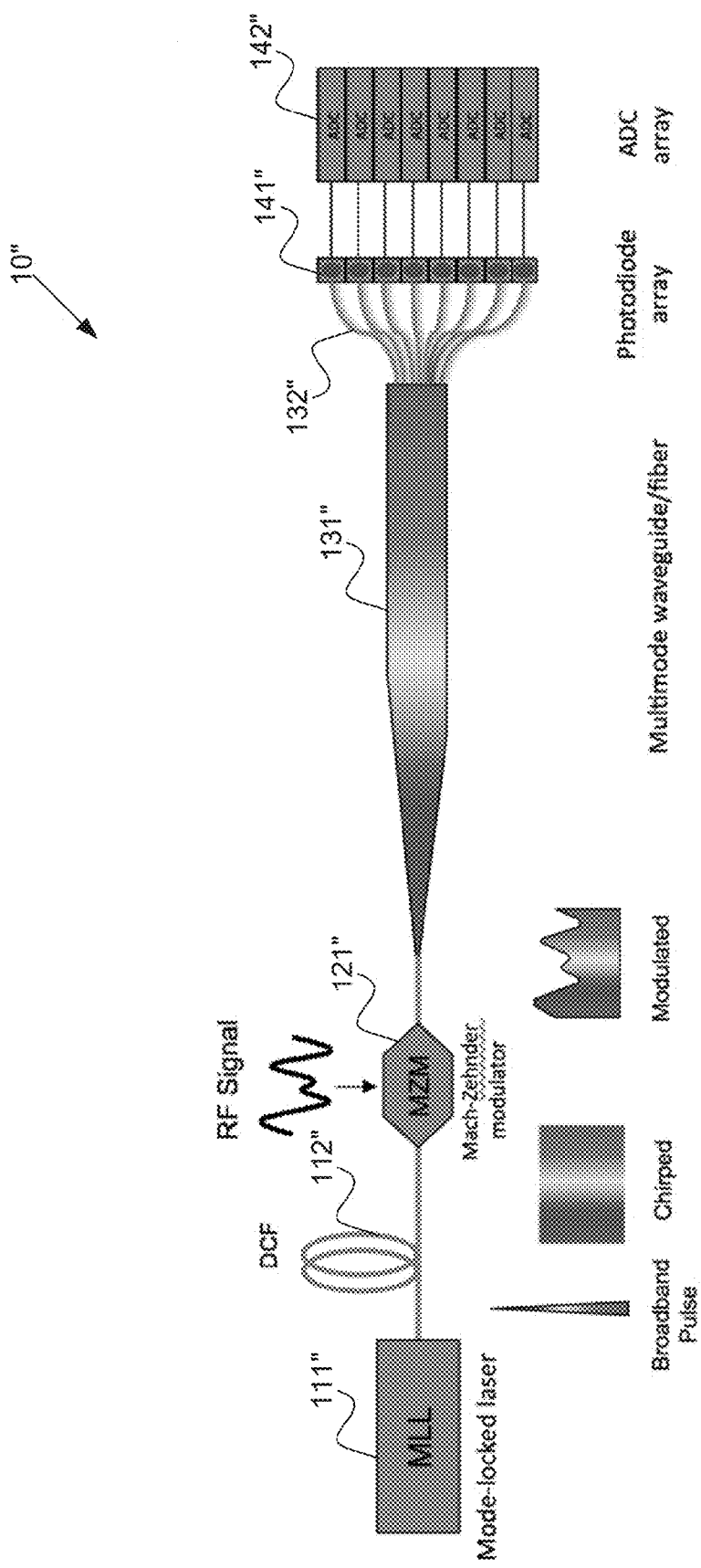

As another example, in system 10" illustrated in FIG. 1D, the optical carrier source can include a mode-locked laser (MLL) 111" configured to generate a broadband optical pulse such as represented in FIG. 1D by the rainbow color components stacked on top of one another from bottom to top and denoted "broadband pulse." The optical carrier source also can include a dispersive optical element, such as a dispersion compensating fiber (DCF) or chirped fiber Bragg grating (CFBG) 112" configured to chirp the broadband optical pulse such as represented in FIG. 1D by the rainbow components arranged next to each other from right to left and denoted "chirped." Such optical carrier is received by optical modulator 121", such as a Mach-Zehnder modulator (MZM), which imposes an RF signal upon the chirped optical pulse such as represented in FIG. 1D by the rainbow components arranged next to each other from right to left, with intensity variations, and denoted "modulated." The multi-mode optic can include multi-mode waveguide/fiber 131" that receives as input the RF signal imposed upon the chirped optical pulse, and outputs (directly, or indirectly via guided-wave optics 132") a speckle pattern to a signal recovery processor that includes photodiode array 141" and ADCs 142" that can be configured analogously as those discussed herein with reference to FIG. 7.

Figure 8:
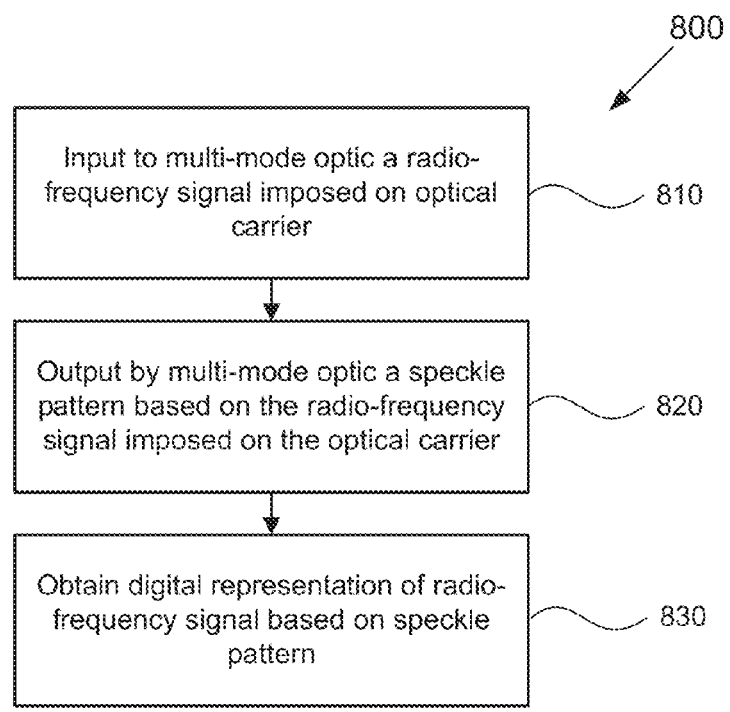
FIG. 8 illustrates steps in an exemplary method for obtaining a digital representation of an RF signal using a multi-mode optic, according to some embodiments of the present invention.
Figure 9A:
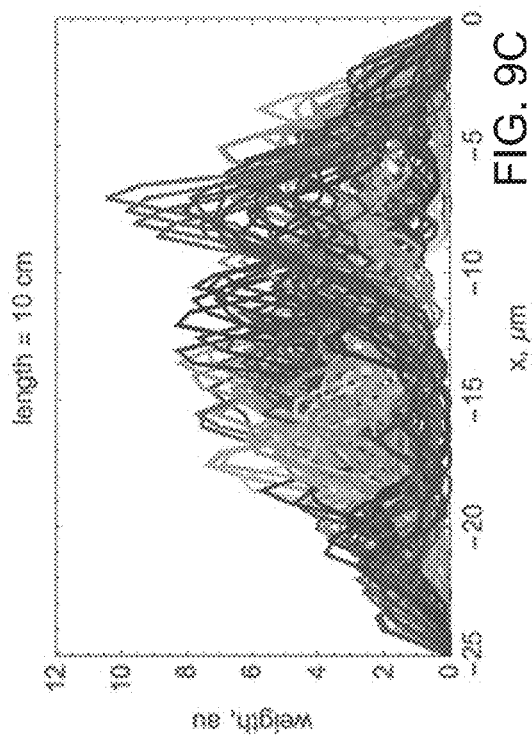
FIGS. 9A-9D illustrate spatial profiles of different wavelengths in an exemplary simulated speckle pattern generated by different lengths of multi-mode optics for an optical carrier, e.g., a chirped optical pulse, according to some embodiments of the present invention.
Figure 9B:
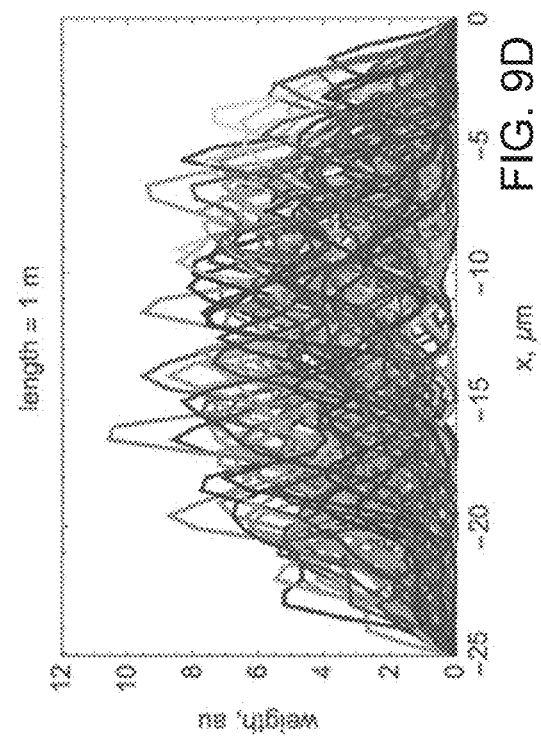
Figure 9C:
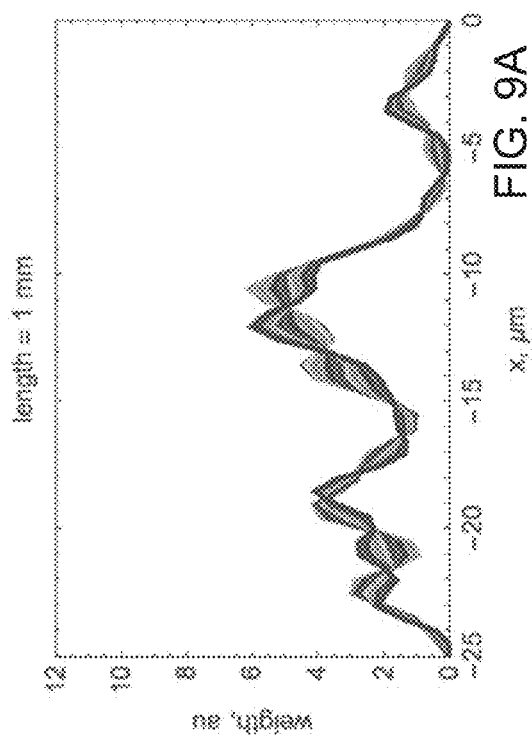
Figure 9D:
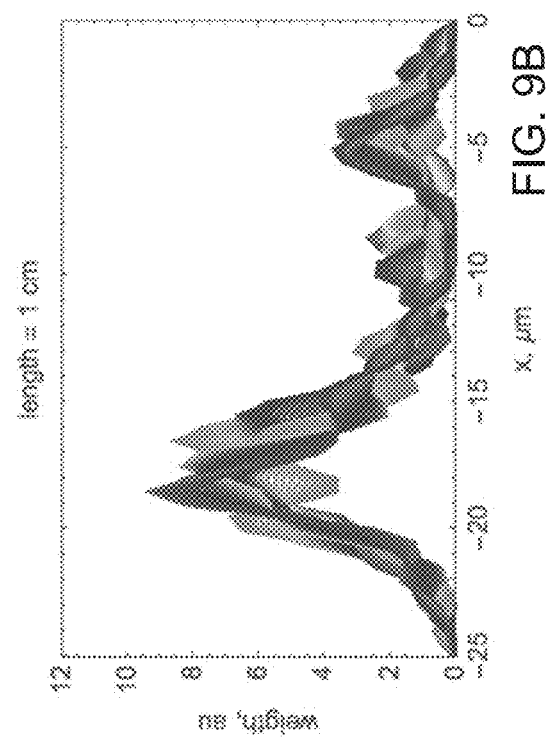

It should be appreciated that systems such as described herein with reference to FIGS. 1A-1D and 7 suitably can be used in any suitable method for obtaining a digital representation of an RF signal. FIG. 8 illustrates steps in an exemplary method 800 for obtaining a digital representation of an RF signal using a multi-mode optic, according to some embodiments of the present invention. At step 810, an RF signal imposed on an optical carrier is input to a multi-mode optic. The optical carrier can include an optical pulse, such as a chirped optical pulse, such as a chirped repetitively pulsed optical signal, such as described above with reference to FIGS. 2A-2D. The RF signal can be received and imposed on an optical carrier in a manner such as discussed above with respect to FIGS. 1A-1D, 3, and 4. For example, an optical-domain representation of the RF signal can be obtained by imposing the signal on the optical carrier, e.g., in the form of an intensity modulation of the carrier. Such a modulation of the optical carrier can be considered to provide an optical-domain representation of the RF signal. The multi-mode optic can include a multi-mode guided-wave optic, such as a fiber or a planar waveguide.

At step 820 illustrated in FIG. 8, the multi-mode optic outputs a speckle pattern based on the RF signal imposed on the optical carrier. Exemplary characteristics of such a speckle pattern are provided elsewhere herein, e.g., with reference to FIGS. 5A-5B, 6A-6C, 9A-9D, 10A-10B, 11A-11B, and 12A-12B.

At step 830 illustrated in FIG. 8, a digital representation of the RF signal is obtained based on the speckle pattern. For example, step 830 can include irradiating an optical sensor with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern. As discussed in greater detail above with reference to FIGS. 5A-5B and 6A-6C, the multi-mode optic can output the optical intensity profile on the first portion of the speckle pattern as a function of wavelength of the optical carrier upon which the radio-frequency signal is imposed. The optical intensity profiles of at least the first and second portions of the speckle pattern can define a mixing matrix. Step 830 can include obtaining a digitized electrical output of the optical sensor, the digital representation of the RF signal being obtained based at least on the digitized electrical output and the mixing matrix. Such processing can include using a dedicated circuit or a computer. The processing can include running a suitable program for signal recovery in software such as Matlab® (The MathWorks, Inc., Natick, Mass.) or Mathematica® (Wolfram Research, Champaign, Ill.).

After the digital representation of the RF signal is obtained, the digital representation can be suitably analyzed. For example, a modulation format of the digital representation can be determined, e.g., using suitable computer software. Non-limiting examples of modulation formats include amplitude modulation, double-sideband modulation, single-sideband modulation, vestigial sideband modulation, quadrature amplitude modulation, angle modulation, frequency modulation, phase modulation, phase-shift keying, binary phase modulation, frequency-shift keying, amplitude shift-keying, on/off keying, continuous phase modulation, orthogonal frequency-division multiplexing modulation, wavelet modulation, Trellis coded modulation, direct-sequence spread spectrum, chirp spread spectrum, frequency-hopping spread spectrum, and pulse position modulation. Previously known demodulation techniques can require prior knowledge of the type of modulation used to encode a signal; for example, previously known demodulation phase-shift keying can require the use of an interferometer to determine the phase of incoming optical pulses. By contrast, a digitized representation of the RF signal can be provided to suitable hardware or software, or a combination thereof, that can be configured to determine the particular type of modulation being used to encode a signal, thus providing substantially more flexibility than previously known demodulators. The digital representation can be demodulated based on the modulation format using, e.g., suitable computer software. The digital representation of the RF signal can be displayed to a user, e.g., using a suitable display device, such as an LCD or LED display.

It should be appreciated that a variety of suitable hardware and software configurations can be used so as to generate and analyze speckle patterns based upon which a digital representation of an RF signal can be obtained. Some exemplary characteristics of multi-mode optics, and some exemplary details of using such multi-mode optics for compressive sensing, include the following.

For a multi-mode optic such as a planar waveguide, analytical solutions exist for the transverse mode distributions and propagation constants $\beta_i$, allowing one to calculate speckle patterns as a function of waveguide length. FIGS. 9A-9D illustrate spatial profiles of different wavelengths in an exemplary simulated speckle pattern generated by different lengths of multi-mode optics for an optical carrier, e.g., a chirped optical pulse, according to some embodiments of the present invention. More specifically, Mathematica® software was used to simulate transverse mode distributions in a planar waveguide with $n_1=3.6$ and $n_2=3.55$, which refractive indices are typical of III-V semiconductors and their alloys, width 50 µm in the x dimension, and arbitrarily small thickness supporting just a single mode in the y direction. Overfilled launch conditions in which equal energy is coupled into all of the waveguide modes were considered. For 101 optical wavelengths from 1.5 to 1.52 µm, FIGS. 9A-9D respectively illustrate the optical intensity at the output of the waveguide as a function of position x along the width of the waveguide for waveguide lengths of 1 mm, 1 cm, 10 cm, and 1 m. Note that the 1 mm waveguide does not provide significant variation in the optical intensity profile as a function of wavelength, while the 1 m waveguide provides significant variation in the optical intensity profile as a function of wavelength. In FIGS. 9A-9D, different colors correspond to the optical intensity profiles at selected wavelengths of the speckle output of the guided-wave optic; each color in FIGS. 9A-9D is reused several times in each plot to represent respective optical intensity profiles of different portions of the speckle pattern.

A characteristic feature of compressive sensing is the mixing matrix that reduces the effective dimension of the measurements from that needed for Nyquist rate sampling, N, (the duration of the time window T divided by twice the maximum frequency in the signal $f_{max}$) to a number M on the order of the sparsity K of the signal. For example, in CS systems, the sparse input signal x (of dimension N) is recovered from a measurement vector y (of dimension M) with M<<N and M being of order K. The vector y can be obtained from x by multiplication by a mixing matrix $\Phi$ such as expressed in Eq. (1), $$y = \Phi x = \Phi \Psi^{-1} s \quad (1)$$

where s is a sparse vector with a small number of non-zero elements and $\Psi$ is the transform that shows the sparsity of x, $s = \Psi x$. Note that x can be referred to as a sparse vector even though it may not have any non-zero elements because it can be linearly transformed into the vector s with a small number of non-zero elements, where the vector s is sparse under the identity transform. Based upon $\Phi$ being a wide matrix (N>>M) and based upon $\Phi$ satisfying certain properties such as described herein or known in the art of compressive sensing, sparse x can be recovered by a wide range of compressive sensing algorithms. In embodiments provided herein, the mixing matrix $\Phi$ can be generated in the analog domain using a multi-mode optic.

Exemplary systems for generating a mixing matrix using a multi-mode optic are described above with reference to FIGS. 1A-1D and 7. For example, in system 10" illustrated in FIG. 1D, moving from left to right, a sequence of pulses from pulsed, e.g., femtosecond, mode-locked laser (MLL) 111" pass though dispersion compensating fiber (DCF) or chirped fiber Bragg grating (CFBG) 112", optionally with dispersion chosen to stretch the pulse to the interpulse time. The resulting chirped pulses then pass through Mach-Zehnder modulator (MZM) 121" that impresses the RF signal on the optical intensity, enter multi-mode optic 131", such as a waveguide or fiber, and finally are split spatially at the output of the optic 131" and directed to photodiode array 141". The electrical signal from the photodiode array 141" is digitized by an array of ADCs 142" operating at and clocked to the mode-locked laser pulse repletion frequency. Time/wavelength mapping in FIG. 1D is shown schematically in the little rainbow icon below and to the right of the MZM denoted "modulated." The optical field at the beginning of the RF pulse is illustrated in red and at the end is illustrated in violet. Speckle patterns in multi-mode optics, such as multi-mode fibers or waveguides, are relatively sensitive to wavelength, and even small changes in wavelength can give completely different patterns at the right hand end of the waveguide. For example, as noted above, FIG. 6A schematically illustrates an exemplary simulated speckle pattern generated by a 1-m long, 105-µm diameter multi-mode cylindrical fiber across all wavelengths in an optical carrier, e.g., a chirped optical pulse, and exemplary positions for optical sensors configured to be irradiated by different portions of the speckle pattern, according to some embodiments of the present invention. As noted above, FIG. 6C shows the intensity as a function of wavelength observed in each of the 76 circles shown in FIG. 6A. Note that the speckle patterns appear to be relatively uncorrelated from circle to circle and appear to decorrelate within a few tenths of a nm in wavelength. In the present systems and methods, different portions of the speckle pattern include the RF signal multiplied by a different, independent pattern; as such, integrating over the duration of the stretched pulse effectively can perform the matrix multiplication of Eq. (1).

Figure 10A:
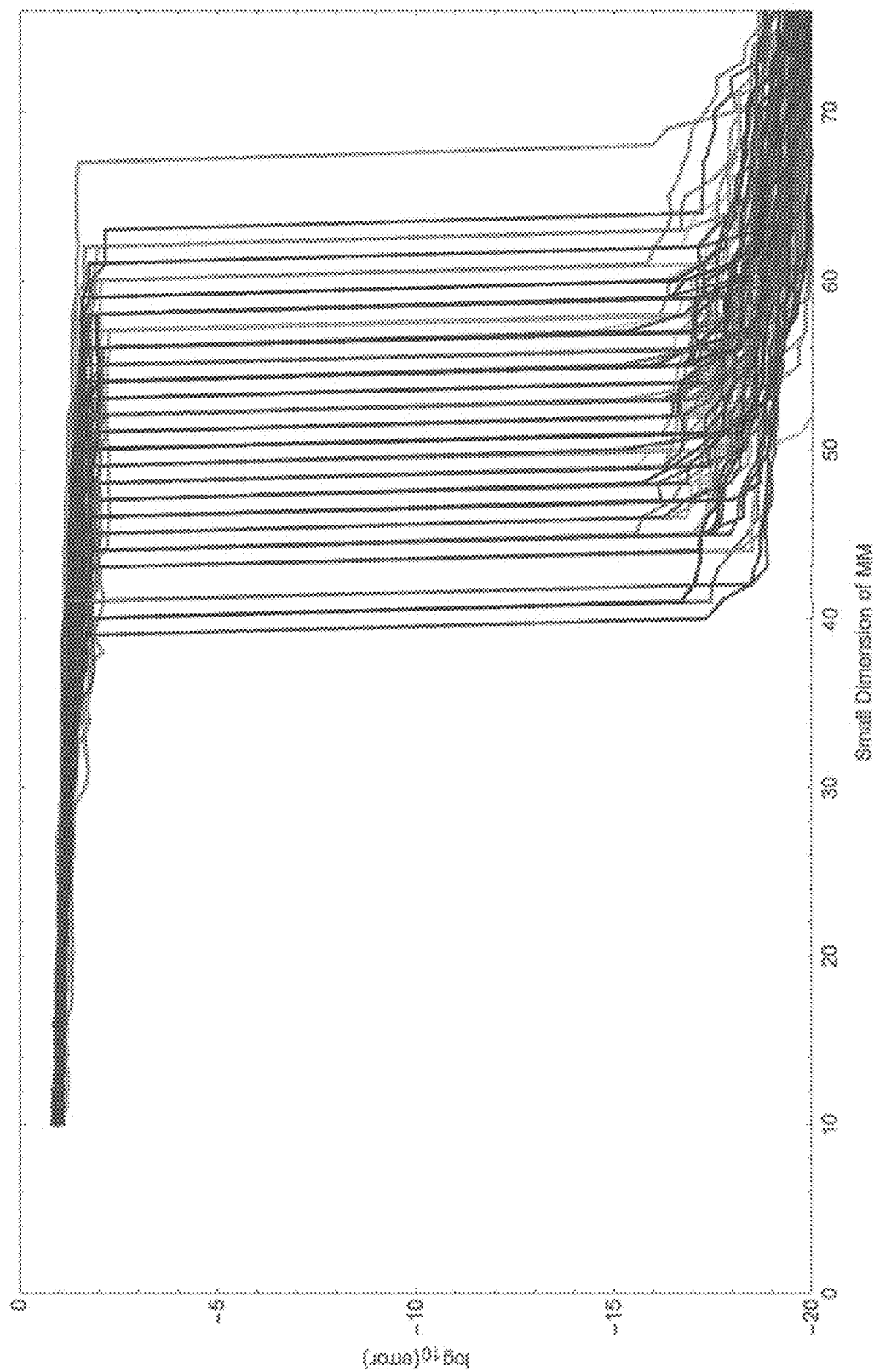
FIG. 10A illustrates exemplary errors in a recovered simulated compressive signal as a function of small dimension of a mixing matrix based on random numbers between 0 and 1.
Figure 10B:
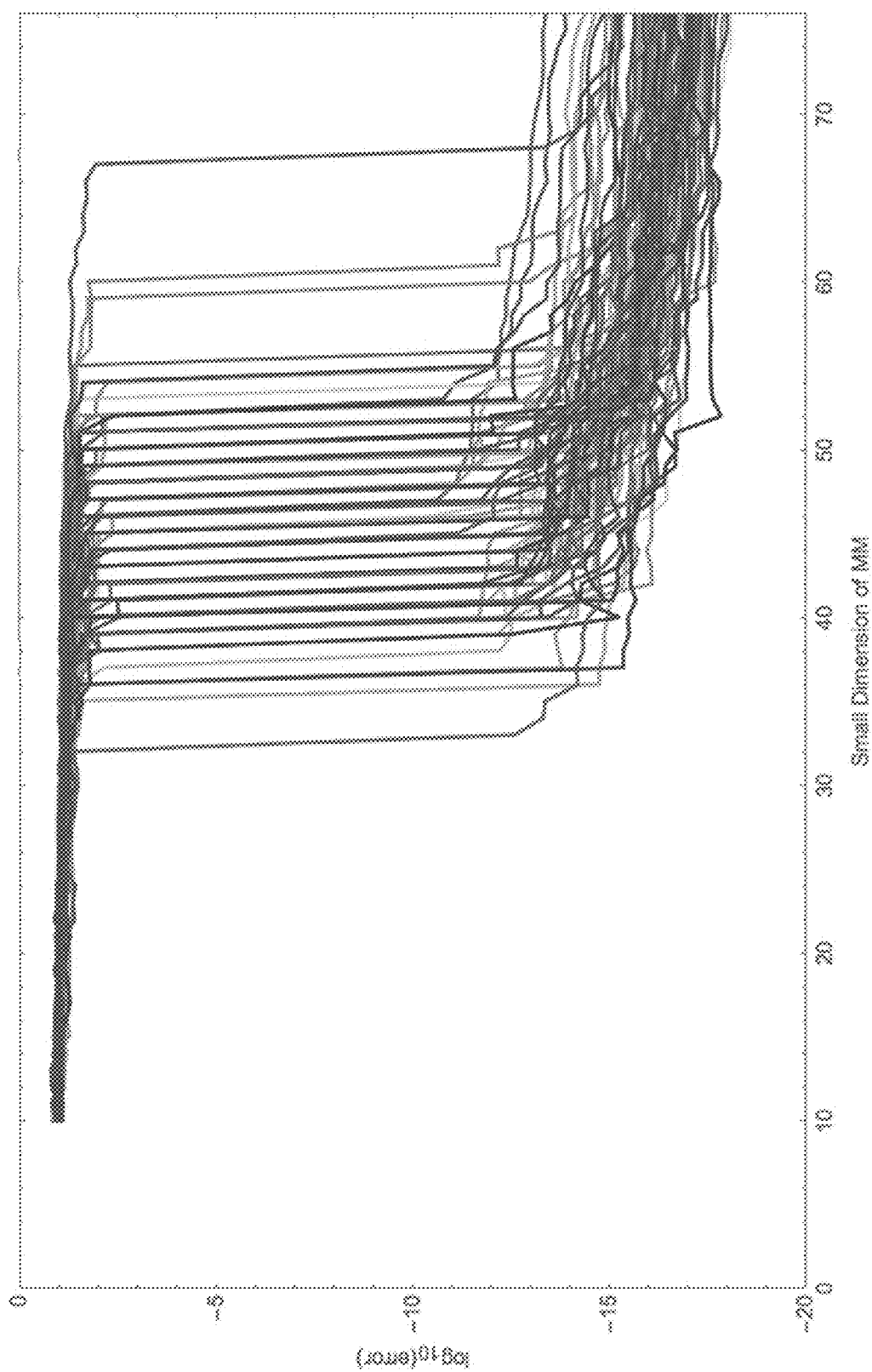
FIG. 10B illustrates exemplary errors in a recovered simulated compressive signal as a function of small dimension of a mixing matrix based on use of a measured speckle pattern having the optical intensity profiles illustrated in FIG. 6C, according to some embodiments of the present invention.

An exemplary first test of a mixing matrix for compressive sensing is to determine the extent to which a signal can be recovered using that mixing matrix in compressive sensing. For the first test, sparse input vectors x with 12 non-zero components were distributed at random in 601 slots. The sparse input vectors x were multiplied by the mixing matrix (of dimension 76×601) to obtain the measurement vector y, and a standard penalized ell-1 norm code (Loris, "L1Packv2: A Mathematica package for minimizing an $l_1$-penalized functional," pg. 1-17 (Aug. 20, 2008)) was used to obtain the recovered vector $x_{rec}$. FIGS. 10A-10B illustrate the mean square error in the recovered signal as a function of the small dimension of the mixing matrix for 100 randomly chosen locations of the 12 non-zero elements. More specifically, FIG. 10A illustrates exemplary errors in a recovered simulated compressive signal as a function of small dimension of a mixing matrix based on random numbers between 0 and 1. FIG. 10B illustrates exemplary errors in a recovered simulated compressive signal as a function of small dimension of a mixing matrix based on use of a speckle pattern having the optical intensity profiles illustrated in FIG. 6C, according to some embodiments of the present invention. Note the qualitative similarity between the speckle and random mixing matrices. In each case, all 100 trials show a relatively sharp transition from no recovery $[\log_{10}(\text{error}) \sim -1]$ to excellent recovery $[\log_{10}(\text{error}) < -12]$. The relatively small dimension of the mixing matrix needed for excellent recovery can be seen to vary from 32 to 68 for the speckle mixing matrix (FIG. 10B) and 40 to 68 for the random mixing matrix (FIG. 10A). These results are consistent with the well known formula for the minimum dimension of the mixing matrix $M_{min} \sim K \log(N/K) = 12 \log(601/12) = 47$. For a given stopping parameter in the penalized ell-1 norm calculations, the random mixing matrix (FIG. 10A) yields lower error while the speckle mixing matrix (FIG. 10B) recovers the signal for smaller values of M than does the random mixing matrix in several realizations.

Figure 11A:
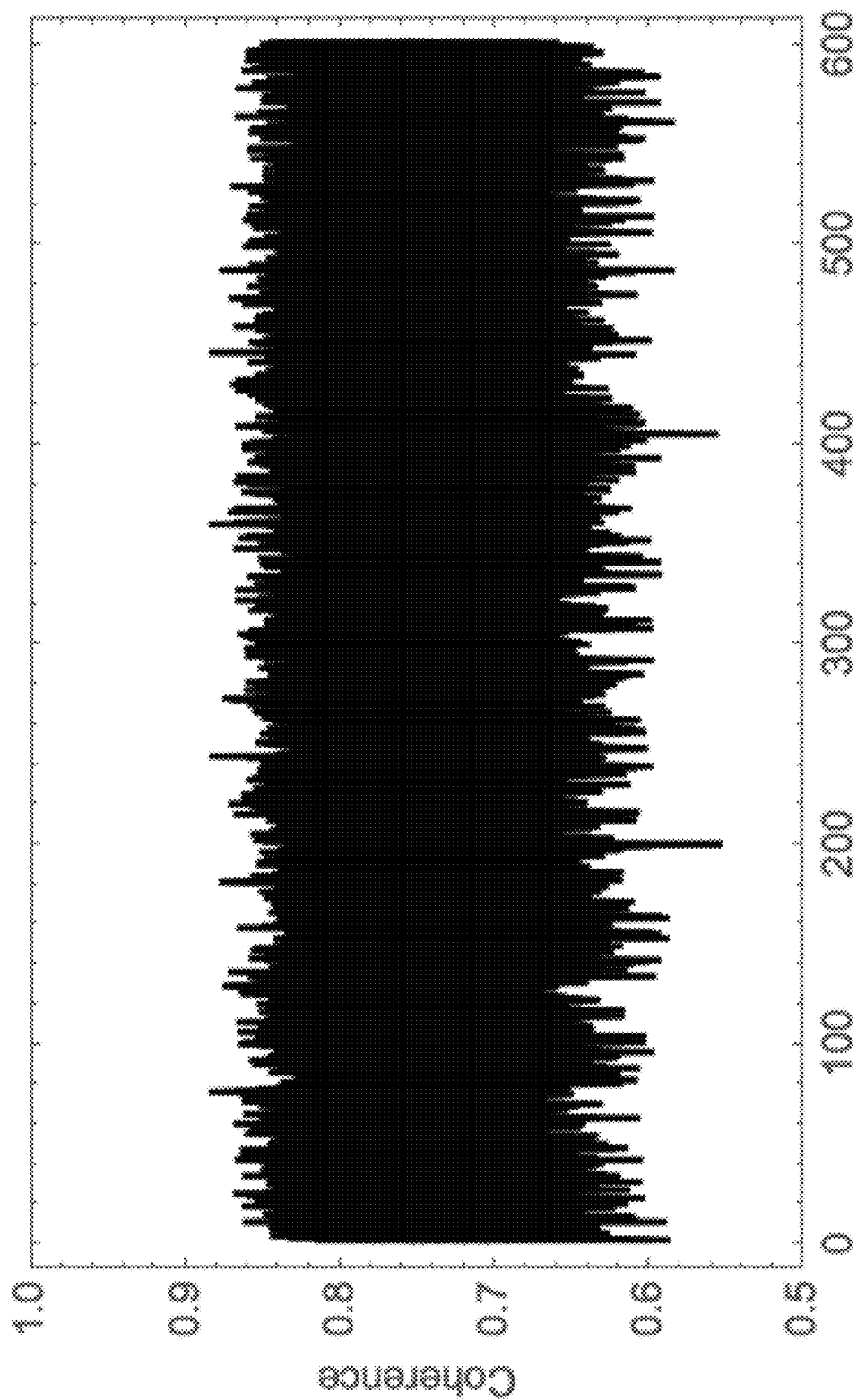
FIG. 11A illustrates mutual coherence of a simulated mixing matrix based on random numbers between 0 and 1.
Figure 11B:
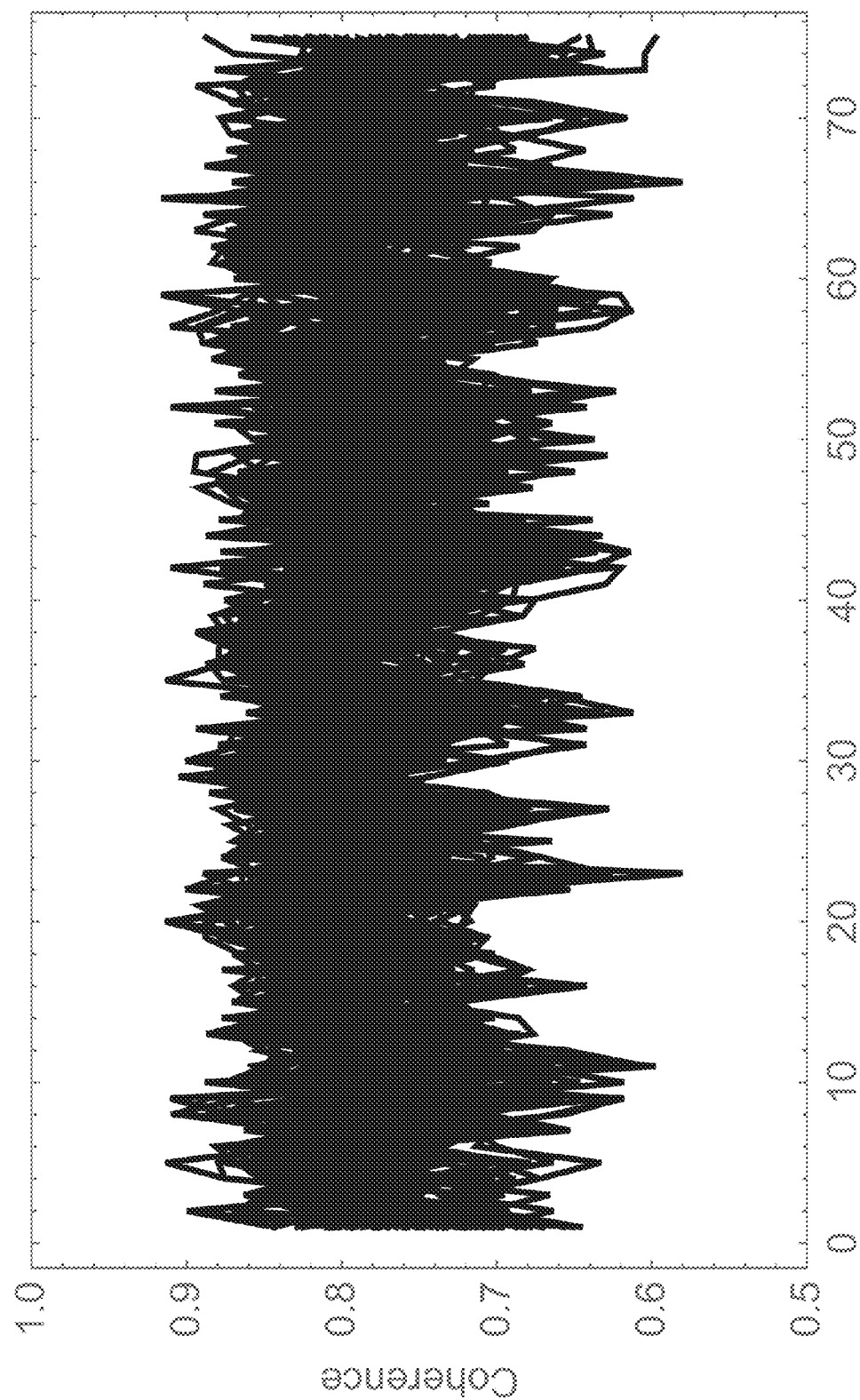
FIG. 11B illustrates mutual coherence of a measured mixing matrix based on use of a speckle pattern having the optical intensity profiles illustrated in FIG. 6C, according to some embodiments of the present invention.

Additionally, as is known in the art of compressive sensing, the rows of the mixing matrix preferably are uncorrelated with the basis vectors in which the input signal is sparse. Additionally, the rows of the mixing matrix preferably are uncorrelated with each other so that each value of y makes an independent measurement. This can be quantified by plotting the normalized mutual coherence $C_{ij} = \Phi(i) \cdot \Phi(j) / [|\Phi(i)||\Phi(j)|]$. FIG. 11A illustrates mutual coherence of a simulated mixing matrix based on random numbers between 0 and 1. FIG. 11B illustrates mutual coherence of a simulated mixing matrix based on use of a speckle pattern having the optical intensity profiles illustrated in FIG. 6C, according to some embodiments of the present invention. It can be seen that the mutual coherence of the simulated mixing matrix based on use of a speckle pattern is similar to that of the simulated mixing matrix based on random numbers between 0 and 1.

For example, the mean coherence of the speckle mixing matrix is only slightly larger than that of the random mixing matrix (0.78 compared to 0.75). Note that the present systems suitably can be modified so as to impose a speckle mixing matrix with elements distributed between −1 and 1 using a scheme similar to that shown in FIG. 1D in which the output of the MZM is split, and half of the signal is input into a second multi-mode optic, splitter, and photodiode array. Then currents from one photodiode coupled to each multi-mode optic can be combined with those from the other multi-mode with the opposite polarity.

Figure 12A:
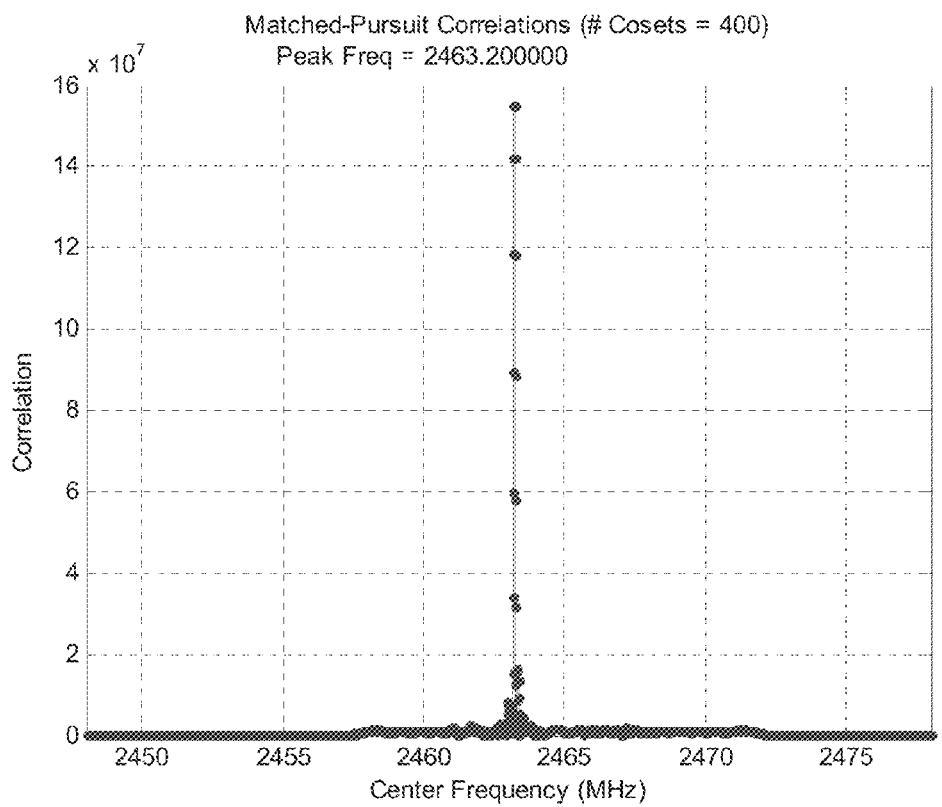
FIG. 12A illustrates recovery results for the carrier frequency of an RF signal imposed on a chirped optical pulse from compressive measurements made using an exemplary embodiment of the present invention.
Figure 12B:
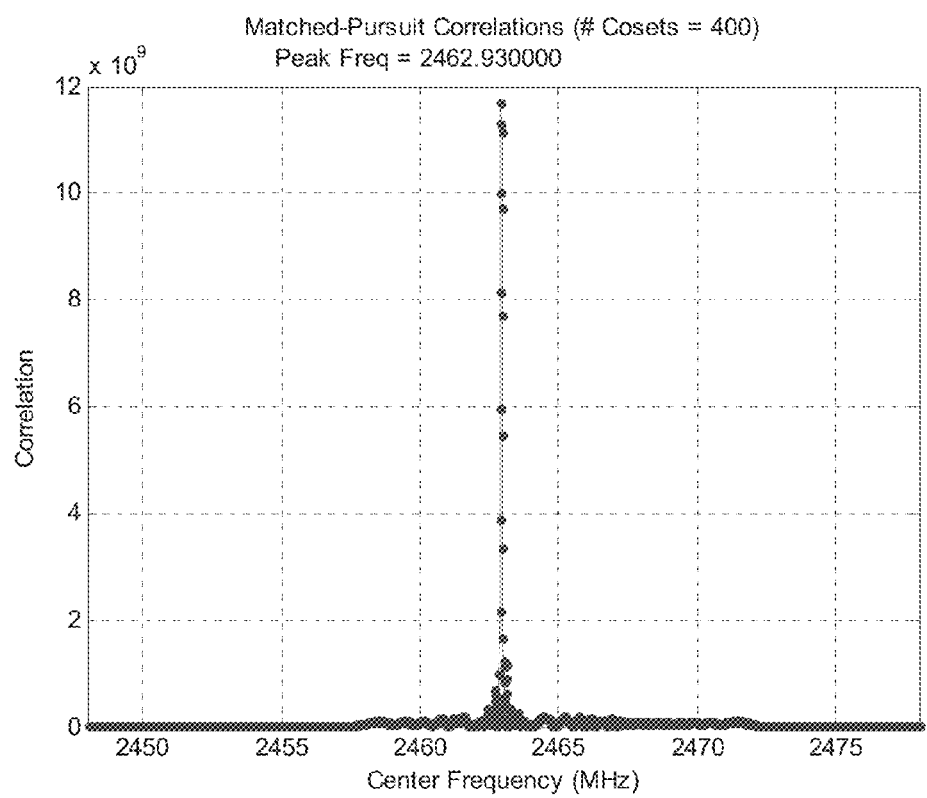
FIG. 12B illustrates recovery results for the carrier frequency of an RF signal imposed on a chirped optical pulse from compressive measurements made using an alternative system.

FIGS. 12A-12B illustrate the effectiveness of the speckle mixing by comparing recovery results for the carrier frequency of an RF chirp pulse obtained using compressive multi-coset measurements from an exemplary embodiment of the present invention (FIG. 12A) to recovery results obtained using similar measurements from an alternative system (FIG. 12B). Compressive multi-coset sampling employs a single row of a mixing matrix. Sequential measurements are processed to recover the input signal. Four hundred measurements were used in FIGS. 12A-12B. A most-likelihood detection algorithm was used in this case. Most-likelihood detection can be used as the first step in matched-pursuit recovery. For this exemplary, nonlimiting embodiment of the present invention, a multimode fiber (1 meter in length, core diameter of 105 microns, numerical aperture of 0.22) was used to generate the speckle and provide the mixing. The alternative system combined a wavelength division demultiplexer, shutters, and a wavelength multiplexer to generate the row of a mixing matrix. Comparable recovery results are obtained using the exemplary embodiment and the alternative system, as respectively can be understood from FIGS. 12A and 12B. The relatively small difference in the reported recovered frequencies can be attributed to an uncorrected time offset between the two sets of measurements and can be understood to be unrelated to both the exemplary embodiment and the alternative system.

In some embodiments, a method is provided for obtaining a digital representation of a radio-frequency signal. The method can include inputting into a multi-mode optic the radio-frequency signal imposed on an optical carrier; outputting by the multi-mode optic a speckle pattern based on the radio-frequency signal imposed on the optical carrier; and obtaining the digital representation of the radio-frequency signal based on the speckle pattern. Nonlimiting examples of such a method are described further herein with reference at least to FIGS. 2A-2D, 4, 5A-5B, 6A-6C, and 8.

In some embodiments, a system is provided for obtaining a digital representation of a radio-frequency signal. The system can include a multi-mode optic configured to receive the radio-frequency signal imposed on an optical carrier and to output a speckle pattern based on the radio-frequency signal imposed on the optical carrier; and a signal recovery processor configured to obtain the digital representation of the radio-frequency signal based on the speckle pattern. Nonlimiting examples of such a system are described further herein with reference at least to FIGS. 1A-1D, 3, and 7.

In some embodiments, an integrated system is provided for obtaining a digital representation of a radio-frequency signal. The integrated system can include a substrate; a receiver configured to receive the radio-frequency signal; a source of an optical carrier; a modulator configured to impose the radio-frequency signal onto the optical carrier; a multi-mode optic defined within the substrate and configured to receive the optical carrier having the radio-frequency signal imposed thereon and to output a speckle pattern based on the optical carrier having the radio-frequency signal imposed thereon; an optical sensor configured to be irradiated with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern; and a signal recovery processor coupled to the optical sensor and configured to obtain the digital representation of the radio-frequency signal based on at least the first portion of the speckle pattern. Nonlimiting examples of such a system are described further herein with reference at least to FIGS. 1A-1D, 3, and 7.

While preferred embodiments of the invention are described herein, it will be apparent to one skilled in the art that various changes and modifications may be made. For example, it should be apparent that the systems and methods provided herein suitably may be used to obtain representations of any received analog or digital signal, including wideband analog or digital signals, in applications including, but not limited to, signals intelligence, software-defined radio, wideband radar, ultra-wideband RF communications, demodulation for optical communications systems with higher order modulation formats, and test and measurement systems such as high speed digital oscilloscopes. The appended claims are intended to cover all such changes and modifications that fall within the true spirit and scope of the invention.

What is claimed:

1. A method for obtaining a digital representation of a radio-frequency signal, the method comprising:
    inputting into a multi-mode optic the radio-frequency signal imposed on an optical carrier;
    outputting by the multi-mode optic a speckle pattern based on the radio-frequency signal imposed on the optical carrier; and
    obtaining the digital representation of the radio-frequency signal based on the speckle pattern.

2. The method of claim 1, wherein the multi-mode optic comprises a multi-mode guided-wave optic.

3. The method of claim 2, wherein the multi-mode guided-wave optic comprises a fiber.

4. The method of claim 2, wherein the multi-mode guided-wave optic comprises a planar waveguide.

5. The method of claim 1, wherein the optical carrier comprises a chirped optical pulse.

6. The method of claim 1, further comprising irradiating an optical sensor with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern.

7. The method of claim 6, wherein the multi-mode optic imposes the optical intensity profile on the first portion of the speckle pattern as a function of wavelength of the optical carrier upon which the radio-frequency signal is imposed.

8. The method of claim 7, wherein the optical intensity profiles of at least the first and second portions of the speckle pattern define a mixing matrix.

9. The method of claim 8, further comprising obtaining a digitized electrical output of the optical sensor, the digital representation being obtained based at least on the digitized electrical output and the mixing matrix.

10. A system for obtaining a digital representation of a radio-frequency signal, the system comprising:
    a multi-mode optic configured to receive the radio-frequency signal imposed on an optical carrier and to output a speckle pattern based on the radio-frequency signal imposed on the optical carrier; and a signal recovery processor configured to obtain the digital representation of the radio-frequency signal based on the speckle pattern.

11. The system of claim 10, wherein the multi-mode optic comprises a multi-mode guided-wave optic.

12. The system of claim 11, wherein the multi-mode guided-wave optic comprises a fiber.

13. The system of claim 11, wherein the multi-mode guided-wave optic comprises a planar waveguide.

14. The system of claim 10, wherein the optical carrier comprises a chirped optical pulse.

15. The system of claim 10, further comprising an optical sensor configured to be irradiated with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern.

16. The system of claim 15, wherein the multi-mode optic imposes the optical intensity profile on the first portion of the speckle pattern as a function of wavelength of the optical carrier upon which the radio-frequency signal is imposed.

17. The system of claim 16, wherein the optical intensity profiles of at least the first and second portions of the speckle pattern define a mixing matrix.

18. The system of claim 17, further comprising circuitry configured to obtain a digitized electrical output of the optical sensor, the signal recovery processor being configured to obtain the digital representation based at least on the digitized electrical output and the mixing matrix.

19. An integrated system for obtaining a digital representation of a radio-frequency signal, the integrated system comprising:
 a substrate;
 a receiver configured to receive the radio-frequency signal;
 a source of an optical carrier;
 a modulator configured to impose the radio-frequency signal onto the optical carrier;
 a multi-mode optic defined within the substrate and configured to receive the optical carrier having the radio-frequency signal imposed thereon and to output a speckle pattern based on the optical carrier having the radio-frequency signal imposed thereon;
 an optical sensor configured to be irradiated with a first portion of the speckle pattern, the first portion of the speckle pattern including an optical intensity profile that is different than an optical intensity profile of a second portion of the speckle pattern, the first portion of the speckle pattern being spatially separated from the second portion of the speckle pattern; and
 a signal recovery processor coupled to the optical sensor and configured to obtain the digital representation of the radio-frequency signal based on at least the first portion of the speckle pattern.

20. The system of claim 19, wherein the receiver, the source, the modulator, and the optical sensor are defined in or disposed on the substrate.

* * * * *